United States Patent
You et al.

(10) Patent No.: US 9,640,659 B2
(45) Date of Patent: May 2, 2017

(54) METHODS OF FABRICATING SEMICONDUCTOR DEVICES INCLUDING HARD MASK PATTERNING

(71) Applicants: Junggun You, Ansan-si (KR); Jeongmin Choi, Suwon-si (KR); Ingyum Kim, Bucheon-si (KR)

(72) Inventors: Junggun You, Ansan-si (KR); Jeongmin Choi, Suwon-si (KR); Ingyum Kim, Bucheon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/050,784

(22) Filed: Feb. 23, 2016

(65) Prior Publication Data
US 2016/0247730 A1    Aug. 25, 2016

(30) Foreign Application Priority Data

Feb. 24, 2015 (KR) .................. 10-2015-0025783

(51) Int. Cl.
*H01L 21/8234* (2006.01)
*H01L 29/78* (2006.01)
*H01L 29/66* (2006.01)

(52) U.S. Cl.
CPC .. *H01L 29/7848* (2013.01); *H01L 21/823431* (2013.01); *H01L 21/823468* (2013.01); *H01L 21/823481* (2013.01); *H01L 29/6681* (2013.01); *H01L 29/66545* (2013.01)

(58) Field of Classification Search
CPC ..... H01L 21/823864; H01L 21/823878; H01L 21/823821; H01L 21/823814; H01L 29/66545; H01L 29/66636; H01L 29/7848
See application file for complete search history.

(56) References Cited

U.S. PATENT DOCUMENTS

| | | |
|---|---|---|
| 6,313,494 B1 | 11/2001 | Koga |
| 8,610,176 B2 | 12/2013 | Patel et al. |
| 8,736,061 B2 | 5/2014 | Johnson et al. |
| 2009/0253238 A1* | 10/2009 | Shi ................ H01L 21/82343 438/279 |
| 2011/0108919 A1 | 5/2011 | Chinthakindi et al. |
| 2013/0015529 A1* | 1/2013 | Zhong ............ H01L 21/82380 257/369 |
| 2013/0228866 A1* | 9/2013 | Lee .................. H01L 21/82343 257/355 |
| 2013/0323894 A1 | 12/2013 | Yin et al. |

(Continued)

*Primary Examiner* — Asok K Sarkar
*Assistant Examiner* — Dmitriy Yemelyanov
(74) *Attorney, Agent, or Firm* — Myers Bigel, P.A.

(57) ABSTRACT

Methods of fabricating semiconductor devices may include forming an isolation region that defines a plurality of fin active regions on a semiconductor substrate, forming a sacrificial gate layer on the semiconductor substrate, forming a first hard mask line that crosses first and second fin active regions and an edge bard mask line that crosses an edge fin active region, and forming a gate cut mask having a plurality of gate cut openings. The plurality of gate cut openings may include first and second gate cut openings that have a first width and are adjacent to the first and second fin active regions, respectively, and an edge gate cut opening that is adjacent to the edge fin active region and has a second width that is greater than the first width but smaller than twice a size of the first width.

20 Claims, 32 Drawing Sheets

(56) References Cited

U.S. PATENT DOCUMENTS

| | | |
|---|---|---|
| 2014/0021548 A1 | 1/2014 | Furukawa et al. |
| 2014/0042529 A1 | 2/2014 | Yamamoto et al. |
| 2014/0077288 A1 | 3/2014 | Yamamoto et al. |
| 2014/0113426 A1 | 4/2014 | Cantell et al. |
| 2014/0191300 A1 | 7/2014 | Jhaveri et al. |
| 2014/0339647 A1* | 11/2014 | Rashed ................ H01L 21/845 257/401 |

* cited by examiner

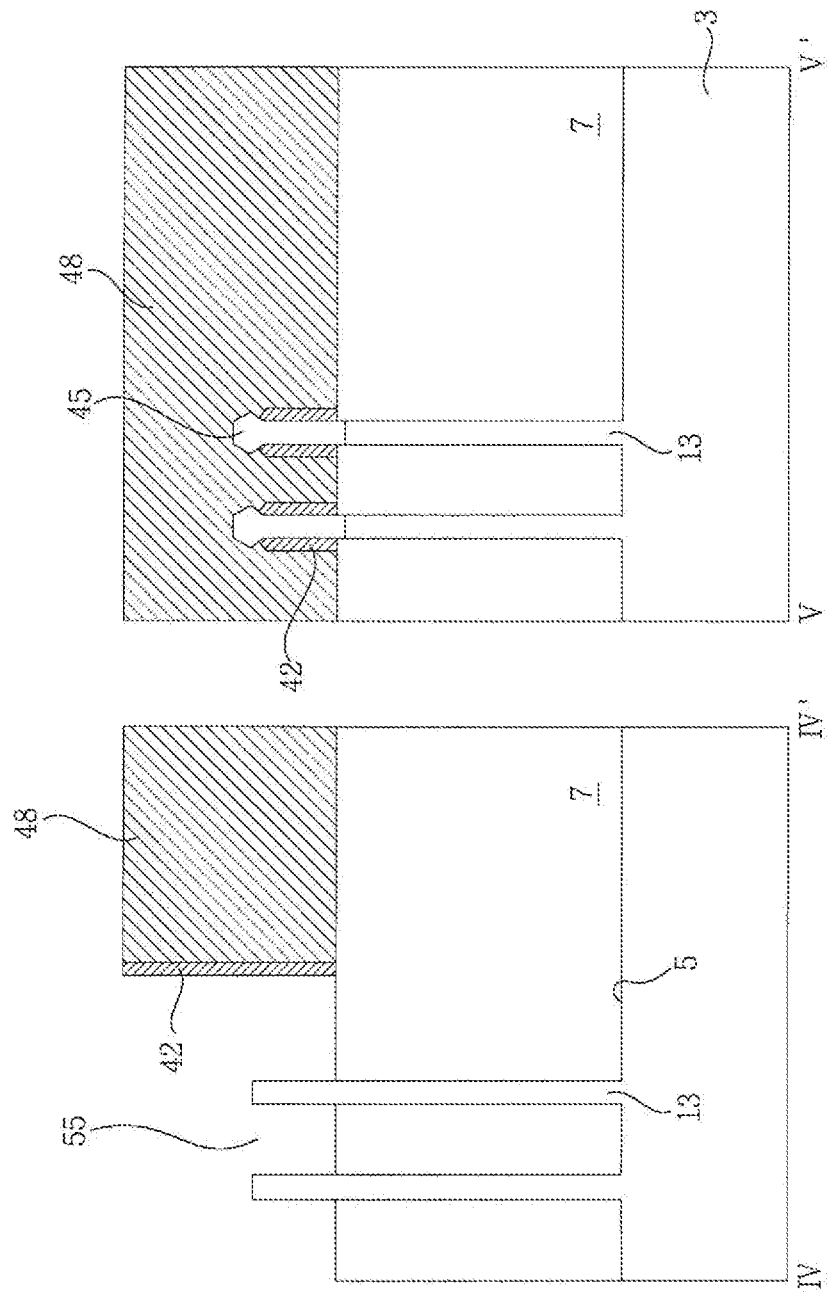

METHODS OF FABRICATING SEMICONDUCTOR DEVICES INCLUDING HARD MASK PATTERNING

CROSS-REFERENCE TO RELATED APPLICATION

This application claims priority under 35 U.S.C. §119 to Korean Patent Application No. 10-2015-0025783 filed on Feb. 24, 2015 in the Korean Intellectual Property Office, the disclosure of which is hereby incorporated herein by reference in its entirety.

BACKGROUND

Technical Field

Embodiments of the inventive concepts relate to methods of fabricating semiconductor devices and, in particular, methods of fabricating semiconductor devices including fin active regions, and electronic systems using the same.

Description of Related Art

With the trend of an increasing degree of integration of semiconductor devices, sizes of transistors are getting smaller and short channel effects of the transistors are gradually increasing. In order to reduce or prevent the short channel effect of the transistor, a finFET structure has been proposed. However, when reduced size transistors with finFET structure are formed, unexpected defects may occur, yields may be reduced, and productivity may be decreased.

SUMMARY

According to some embodiments of the inventive concepts, methods of fabricating semiconductor device are provided. A method may include forming an isolation region that defines a plurality of fin active regions on a semiconductor substrate that extend parallel to each other in a first direction. The plurality of in active regions may include a first fin active region and a second fin active region that may be spaced apart from each other by a first distance, a third fin active region and a fourth fin active region that may be spaced apart from each other by a second distance that is smaller than the first distance, and an edge fin active region. A sacrificial gate layer may be formed on the semiconductor substrate having the isolation region. A plurality of hard mask lines may be formed on the sacrificial gate layer, and the plurality of hard mask lines may include a first hard mask line that crosses the first and second fin active regions, a second hard mask line that crosses the third and fourth fin active regions, and an edge hard mask line that crosses the edge fin active region. A gate cut mask having a plurality of gate cut openings may be formed on the semiconductor substrate having the hard mask lines. The plurality of gate cut openings may include a first gate cut opening, a second gate cut opening, and an edge gate cut opening. The first and second gate cut openings and the edge gate cut opening may have line shapes that are parallel to each other. The first and second gate cut openings may be spaced apart from each other and may expose the first hard mask line on the sacrificial gate layer between the first and second fin active regions. The edge gate cut opening may not not overlap the edge fin active region and may expose an end portion of the edge hard mask line. Each of the first and second gate cut openings may have a first width that are equal to each other and the edge gate cut opening may be formed to have a second width that is greater than the first width but smaller than twice a size of the first width. The hard mask lines may be etched using the gate cut mask as an etch mask to form hard mask patterns. The gate cut mask may be removed.

In some embodiments, the gate cut mask may further include a third gate cut opening, and the third gate cut opening may expose the second hard mask line on the sacrificial gate layer between the third and fourth fin active regions.

In some embodiments, the third gate cut opening may have a third width that is greater than the second width.

In some embodiments, the third gate cut opening may have a width that is greater than the first width but smaller than 22 times the size of the first width.

In some embodiments, a distance between the first and second gate cut openings may be at least 20 times the size of the first width.

In some embodiments, the edge gate cut opening may have a first side wall and a second side wall that are parallel to the edge fin active region, and the first side wall of the edge gate cut opening may overlap the edge hard mask line and the second side wall of the edge gate cut opening may not overlap the edge hard mask line.

In some embodiments, a distance between the first side wall of the edge gate cut opening and the end portion of the edge hard mask line may be greater than a distance between the second side wall of the edge gate cut opening and the end portion of the edge hard mask line.

In some embodiments, a distance between the first side wall of the edge gate cut opening and the end portion of the edge hard mask line may be the same size as the first width of each of the first and second gate cut openings.

In some embodiments, the hard mask patterns may include a first hard mask pattern that overlaps the first fin active region, a second hard mask pattern that overlaps the second fin active region, an intermediate hard mask pattern between the first and second hard mask patterns, a third hard mask pattern that overlaps the third fin active region, a fourth hard mask pattern that overlaps the fourth fin active region, and an edge hard mask pattern that overlaps the edge fin active region. The intermediate hard mask pattern may not overlap the plurality of fin active regions.

In some embodiments, the method may further include etching the sacrificial gate layer using the hard mask patterns as etch masks to form sacrificial gate patterns, forming gate spacers on side surfaces of the sacrificial gate patterns and the hard mask patterns, and side surfaces of protruding parts of the fin active regions, etching the fin active regions using the hard mask patterns and the gate spacers as etch masks to form active recessed regions, performing a selective epitaxial growth (SEG) process to form semiconductor layers in the active recessed regions. The semiconductor layers may fill the active recessed regions and protrude from the fin active regions. Protruding parts of the semiconductor layers may have widths that are greater than widths of the fin active regions. The method may include forming a planarized interlayer insulating layer on side walls of the sacrificial gate patterns, removing the hard mask patterns, removing the sacrificial gate patterns to form gate trenches, and forming gate structures in the gate trenches.

According to some embodiments of the inventive concepts, methods of fabricating semiconductor devices may be provided. A method may include forming an isolation region that defines a plurality of fin active regions on a semiconductor substrate that may extend parallel to each other in a first direction. The plurality of fin active regions may include a first fin active region and a second fin active region that are spaced apart from each other by a first distance, a third fin active region and a fourth fin active region that arc spaced apart from each other by a second distance that is smaller than the first distance, and an edge fin active region. A sacrificial gate layer may be formed on the semiconductor substrate having the isolation region. A plurality of hard mask lines may be formed on the sacrificial gate layer that may extend parallel to each other in a second direction that is perpendicular to the first direction. The plurality of hard mask lines may include a first hard mask line that crosses the first and second fin active regions, a second hard mask line that crosses the third and fourth fin active regions, and an edge hard mask line that crosses the edge fin active region and extends over the isolation region. A gate cut mask having a plurality of gate cut openings may be formed on the semiconductor substrate having the plurality of hard mask lines. The plurality of gate cut openings may include a first gate cut opening and a second gate cut opening on the sacrificial gate layer between the first and second fin active regions that expose the first hard mask line and may extend parallel to each other in the first direction, and a third gate cut opening on the sacrificial gate layer between the third and fourth fin active regions that exposes the second hard mask line. The first and second gate cut openings may each have a first width that is the same. A distance between the first and second gate cut openings may be at least 20 times a size of the first width. The hard mask lines may be etched using the gate cut mask as an etch mask to form hard mask patterns. The gate cut mask may be removed.

In some embodiments, the plurality of gate cut openings may further include an edge gate cut opening that extends in a line shape that is parallel to the edge fin active region, that does not overlap the edge fin active region, and that exposes the edge hard mask line. The edge gate cut opening may have a first side wall and a second side wall that extend parallel to the edge fin active region. The first side wall of the edge gate cut opening may overlap the edge hard mask line. The second side wall of the edge gate cut opening may not overlap the edge hard mask line. A distance between the first side wall of the edge gate cut opening and an end portion of the edge hard mask line may be greater than a distance between the second side wall of the edge gate cut opening and the end portion of the edge hard mask line.

In some embodiments, the edge gate cut opening may be parallel to the first and second gate cut openings and may be formed in a line shape that has a second width that is greater than the first width.

In some embodiments, a distance between the first gate cut opening and the first fin active region, a distance between the second gate cut opening and the second fin active region, a distance between the third gate cut opening and the third fin active region, a distance between the fourth gate cut opening and the fourth fin active region, and a distance between the edge gate cut opening and the edge fin active region may be all the same.

In some embodiments, the third gate cut opening may have a width that is greater than widths of the first and second gate cut openings.

According to some embodiments of the inventive concepts, methods of fabricating semiconductor devices may be provided. A method may include forming an isolation region that defines a plurality of fin active regions on a semiconductor substrate. The plurality of fin active regions may include a first fin active region and a second fin active region that are spaced apart from each other by a first distance and an edge fin active region. A sacrificial gate layer may be formed on the semiconductor substrate having the isolation region. A first hard mask line that crosses the first and second fin active regions and an edge hard mask line that crosses the edge fin active region may be formed on the sacrificial gate layer. A gate cut mask having a plurality of gate cut openings may be formed on the semiconductor substrate having the first and the edge hard mask lines. The plurality of gate cut openings may include a first gate cut opening and an edge gate cut opening that have line shapes that are parallel to each other. The first gate cut opening may be parallel to the first fin active region and adjacent to the first fin active region. The edge gate cut opening may be parallel to the edge fin active region and adjacent to the edge fin active region, and may expose an end portion of the edge hard mask line. The first gate cut opening may be formed to have a first width and the edge gate cut opening may be formed to have a second width that is greater than the first width but smaller than twice a size of the first width. The hard mask lines may be etched using the gate cut mask as an etch mask to form hard mask patterns. The gate cut mask may be removed.

In some embodiments, the plurality of gate cut openings may further include a second gate cut opening that is parallel to the second firm active region and adjacent to the second fin active region. The first and second gate cut openings may be formed on the sacrificial gate layer between the first and second fin active regions. The second gate cut opening may have the first width the same as the first gate cut opening, and may be formed in a line shape that is parallel to the first gate cut opening.

In some embodiments, the hard mask patterns may include a first hard mask pattern that crosses the first fin active region, a second hard mask pattern that crosses the second fin active region, an intermediate hard mask pattern on the sacrificial gate layer between the first and second hard mask patterns and an edge hard mask pattern that crosses the edge fin active region.

In some embodiments, a length of the intermediate hard mask pattern may be 20 times or greater a size of a distance between the first hard mask pattern and the intermediate hard mask pattern.

In some embodiments, the method may further include etching the sacrificial gate layer using the hard mask patterns as etch masks to form sacrificial gate patterns, forming gate spacers on side surfaces of the sacrificial gate patterns and the hard mask patterns, and side surfaces of protruding parts of the fin active regions, etching the fin active regions using the hard mask patterns and the gate spacers as etch masks to form active recessed regions, performing an SEG process to form semiconductor layers in the active recessed regions. The semiconductor layers may fill the active recessed regions and protrude from the fin active regions. Protruding parts of the semiconductor layers may have widths that are greater than the fin active regions. The method may further include forming a planarized interlayer insulating layer on side walls of the sacrificial gate patterns, removing the hard mask patterns, removing the sacrificial gate patterns to form gate trenches, and forming gate structures in the gate trenches.

According to some embodiments of the inventive concept, methods of forming semiconductor devices may be provided. A method may include forming a plurality of fin-shaped active regions that extend parallel to each other in a first direction. The plurality of fin-shaped active regions may include a first active region and a second active region that are spaced apart from each other by a first distance. The plurality of fin-shaped active regions may include a third active region and a fourth active region that are spaced apart from each other by a second distance that is less than the first distance. The method may include partially filling a trench that extends around and between ones of the plurality of fin-shaped active regions with an insulating material to form an isolation region. The isolation region may include a first isolation region that extends continuously between a portion of the first active region and a portion of the second active region and may include a second isolation region that extends continuously between a portion of the third active region and a portion of the fourth active region. The method may include forming a sacrificial gate layer that covers the plurality of fin-shaped active regions and the isolation region.

The method may include forming a plurality of hard mask lines on the sacrificial gate layer that may extend parallel to each other in a second direction that is perpendicular to the first direction. The plurality of hard mask lines may include a first hard mask line that crosses the first and second active regions and the first portion of the isolation region therebetween. The plurality of hard mask lines may include a second hard mask line that crosses the third and fourth active regions and the second portion of the isolation region therebetween. The method may include forming a gate cut mask that covers the plurality of hard mask lines and the sacrificial gate layer. The gate cut mask may include a first opening that extends in the first direction adjacent to the first active region and that exposes a first portion of the first hard mask line and first portions of the first isolation region. The gate cut mask may include a second opening that extends in the first direction adjacent to the second active region and that exposes a second portion of the first hard mask line and second portions of the first isolation region. The gate cut mask may include a third opening that extends between the third and fourth active regions and exposes a portion of the second hard mask line and portions of the second isolation region.

The method may include etching the plurality of hard mask lines using the gate cut mask as an etch mask, wherein the first hard mask line is etched to form a first hard mask pattern that crosses the first active region, a second hard mask pattern that crosses the second active region, and an intermediate hard mask pattern therebetween, and wherein the second hard mask line is etched to form a third hard mask pattern that crosses the third active region, and a fourth hard mask pattern that crosses the fourth active region, without an intermediate hard mask pattern therebetween.

In some embodiments, a distance between the first opening and the first active region, a distance between the second opening and the second active region, a distance between the third opening and the third active region, and a distance between the third opening and the fourth active region may all be equal.

In some embodiments, a width in the second direction of the first opening may be equal to a width in the second direction of the second opening. A distance between the first opening and the second opening may be greater than 20 times the width of the first opening. A width of the third opening in the second direction may be less than 22 times the width of the first opening.

In some embodiments, the plurality of fin-shaped active regions may include an edge active region that is an outermost one of the plurality of fin-shaped active regions in the second direction. The plurality of hard mask lines may include a third hard mask line that crosses the edge active region and that includes an end portion. The gate cut mask may include a fourth opening that extends in the first direction over the end portion of the third hard mask line. A width of the fourth opening in the second direction may be greater than a width of the first opening in the second direction and less than 2 times the width of the first opening;

In some embodiments, a distance between the end portion of the third hard mask line and a first sidewall of the fourth opening that extends in the second direction over the third hard mask line may be equal to the width of the first opening. A distance between the end portion of the third hard mask line and a second sidewall of the fourth opening that extends in the second direction opposite the first sidewall may be less than the width of the first opening.

It is noted that aspects of the inventive concepts described with respect to one embodiment, may be incorporated in a different embodiment although not specifically described relative thereto. That is, all embodiments and/or features of any embodiment can be combined in any way and/or combination. These and other objects and/or aspects of the present inventive concepts are explained in detail in the specification set forth below.

BRIEF DESCRIPTION OF THE DRAWINGS

The inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts.

FIGS, 1, 3, 5A, 7, and 9A are plan views schematically illustrating intermediate process operations in methods of fabricating semiconductor devices in accordance with some embodiments of the inventive concepts;

FIGS. 2A, 2B, 2C, 4A, 413, 4C, 6A, 6B, 6C, 8A, 813, 8C, 10A, 10B, 10C, 11A, 11B, 11C, 12A, 12B, 12C, 13A, 13B, and 13C are cross-sectional views schematically illustrating intermediate process operations in methods of fabricating semiconductor devices in accordance with some embodiments of the inventive concepts;

DETAILED DESCRIPTION

Figure 1:
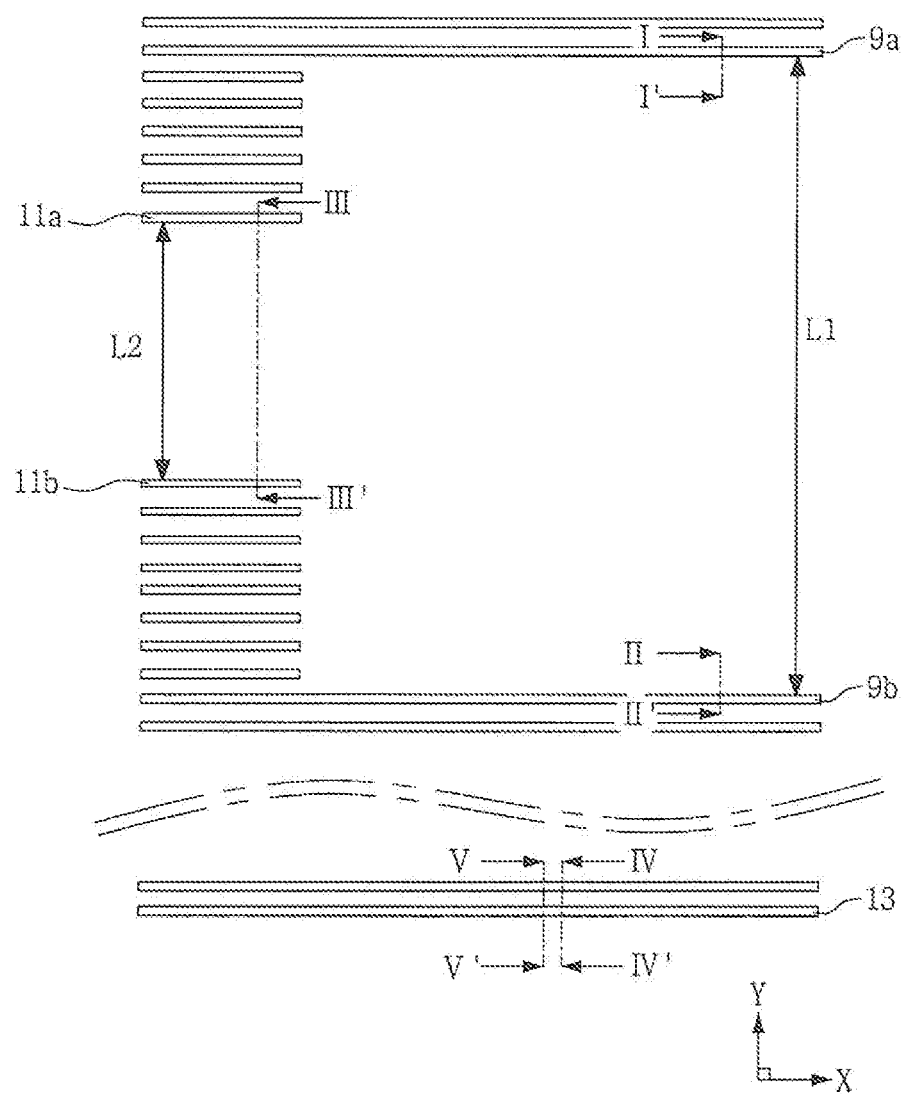
Figure 2A:
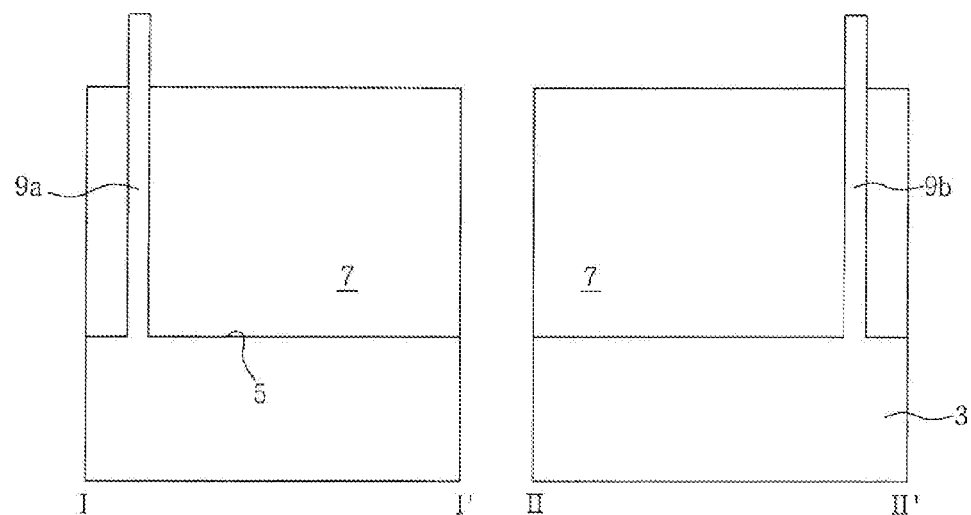
Figure 2B:
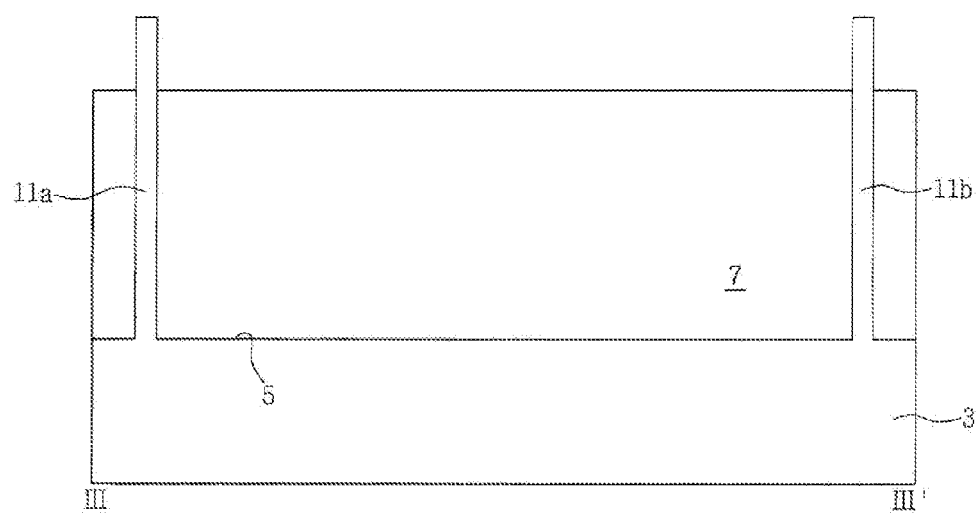
Figure 2C:
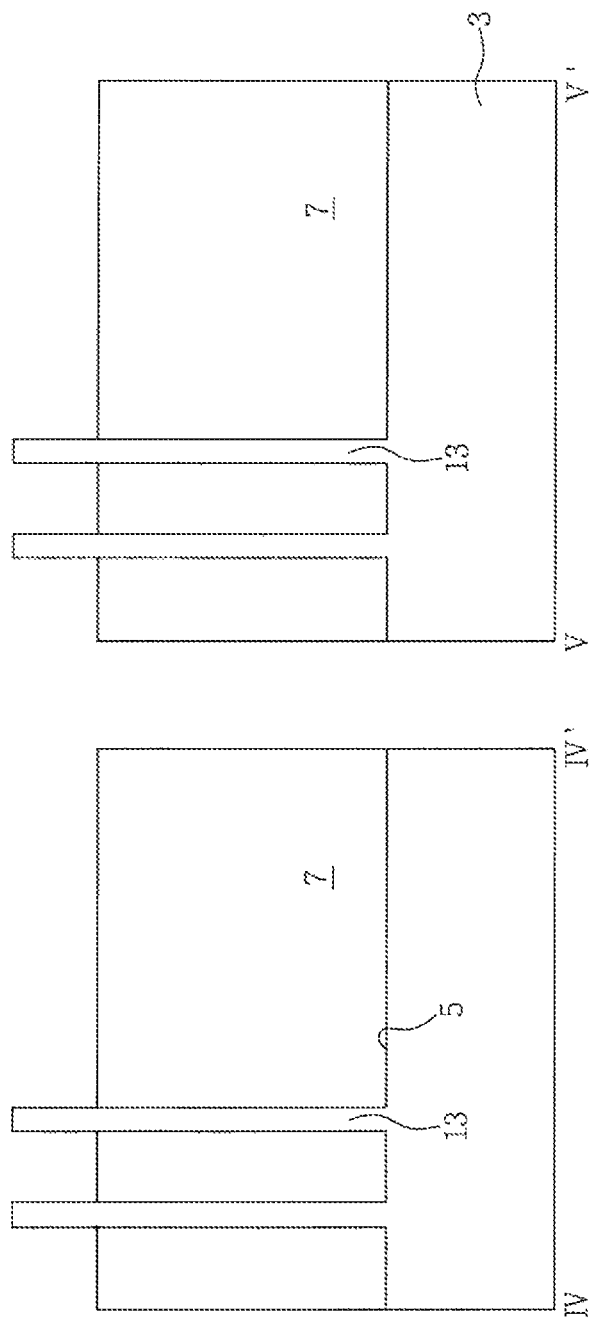
Figure 3:
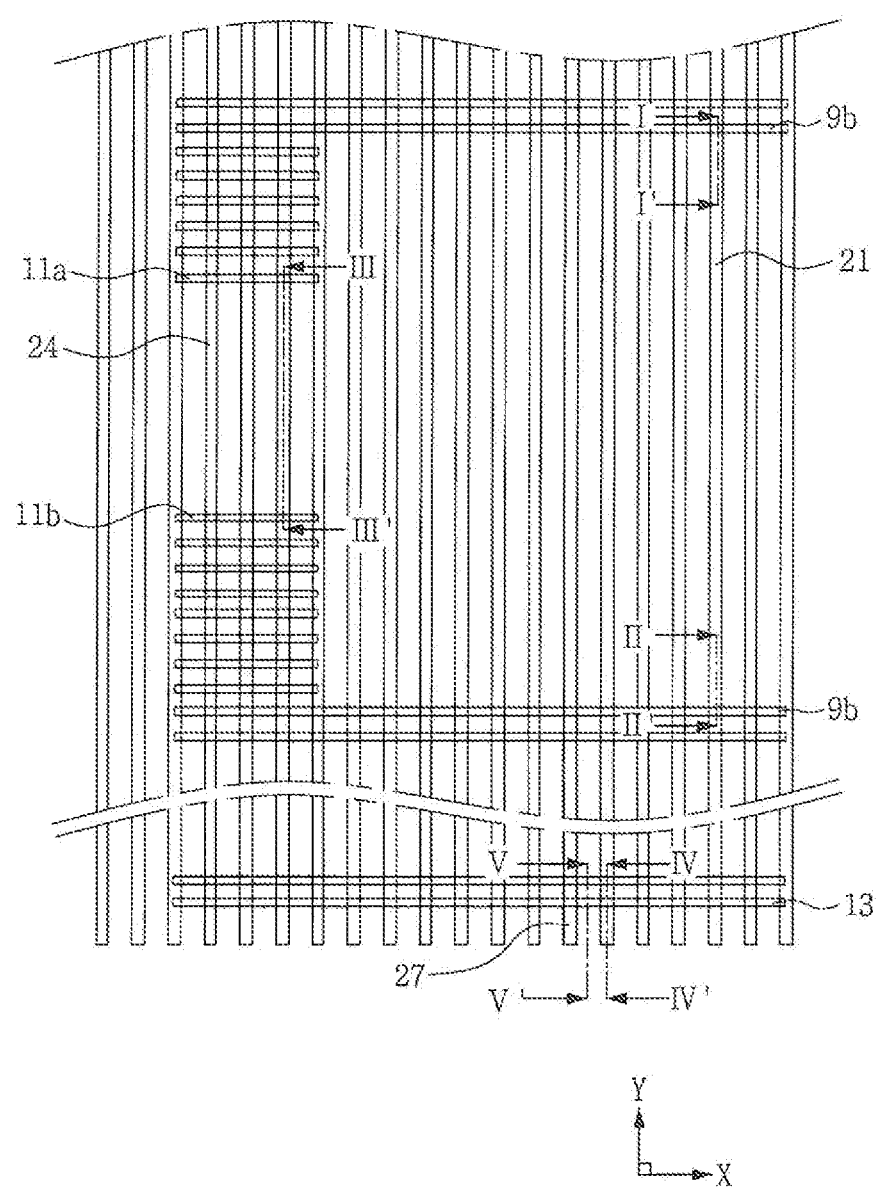
Figure 4A:
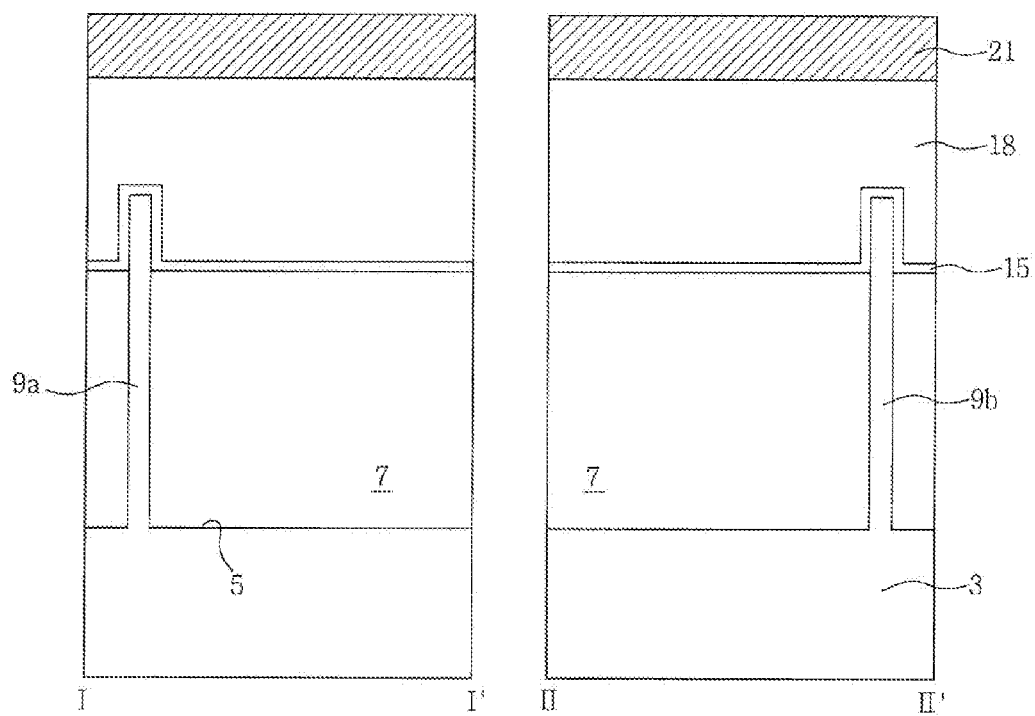
Figure 4B:
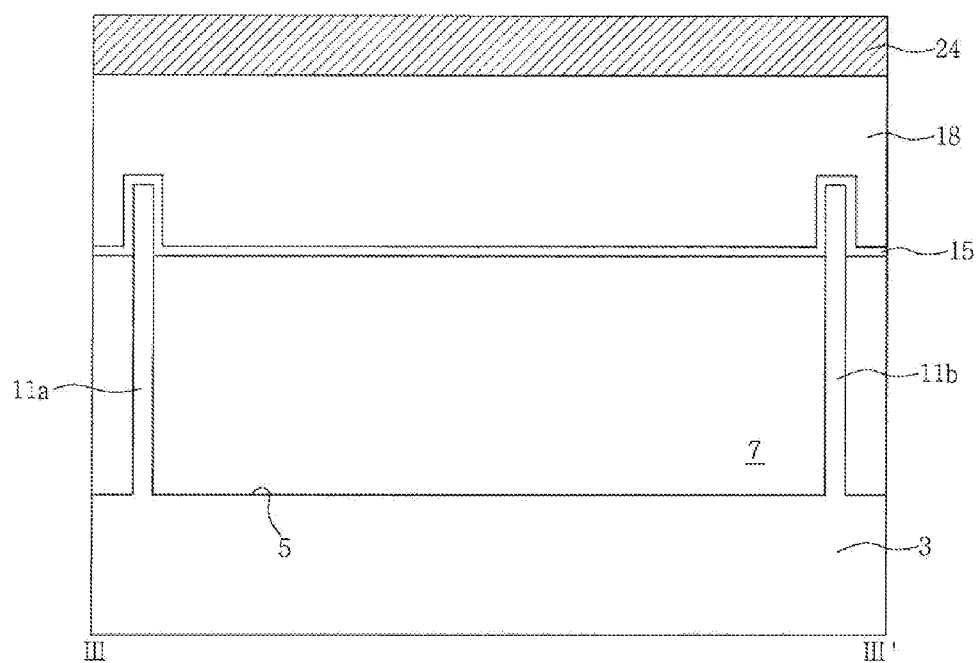
Figure 4C:
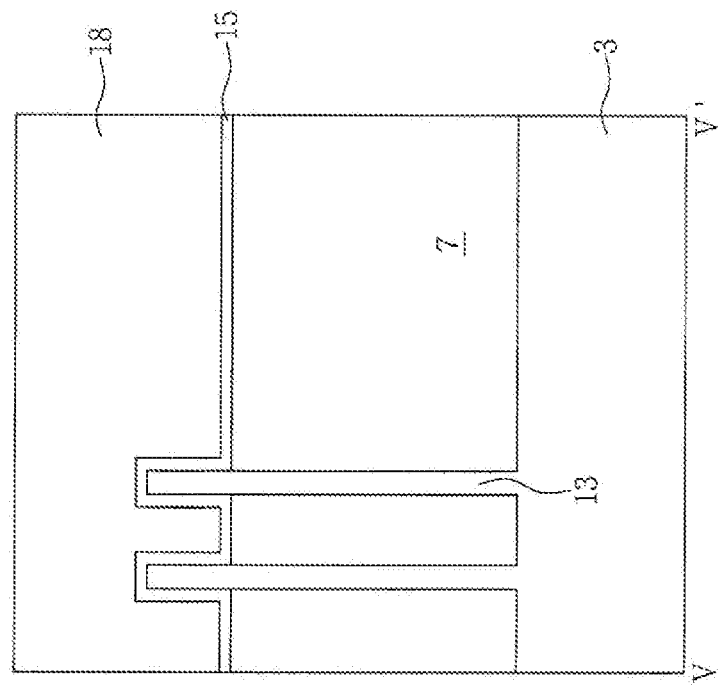
Figure 4C:
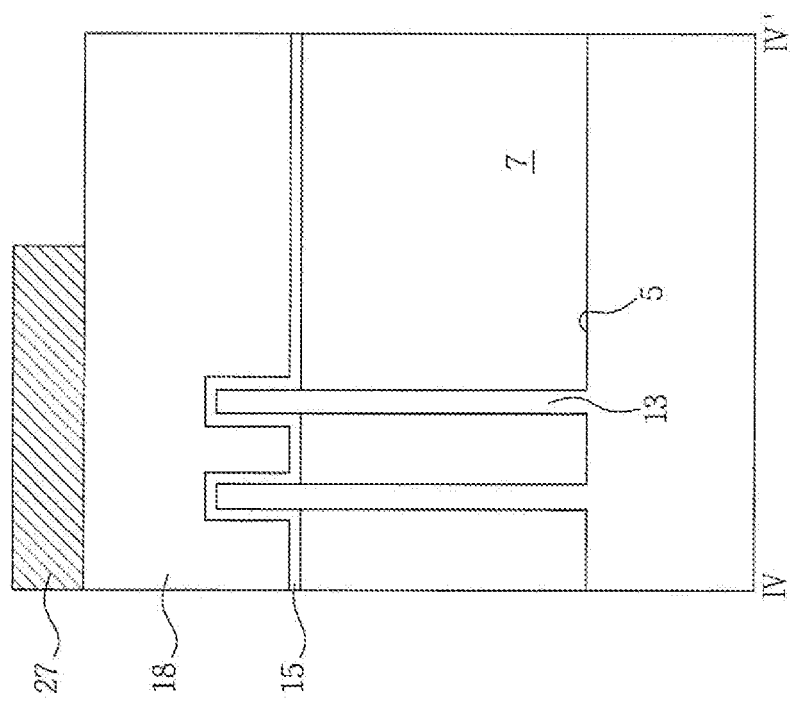

The inventive concepts may be embodied in various different forms, and should be construed as limited, not by the embodiments set forth herein, but only by the accompanying claims. Rather, these embodiments are provided so that this disclosure is thorough and complete and fully conveys the inventive concepts to those skilled in the art In the drawings, the sizes and relative sizes of layers and regions may be exaggerated for clarity. The same reference symbols denote the same components throughout the specification.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, arc to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the inventive concepts but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween. The same reference numerals indicate the same components throughout the specification.

Terms such as "top," "bottom," "upper," "lower," "above," "below," and the like are used herein to describe the relative positions of elements or features, it will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of the inventive concepts.

Furthermore, throughout this disclosure, directional terms such as "upper," "intermediate," "lower," and the like may be used herein to describe the relationship of one element or feature with another, and the inventive concepts should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms may be only used to distinguish one element from another. Thus, a first element could be termed a second element without departing from the teachings of the present inventive concepts.

The terminology used herein to describe embodiments of the invention is not intended to limit the scope of the inventive concepts.

As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concepts belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 5A:
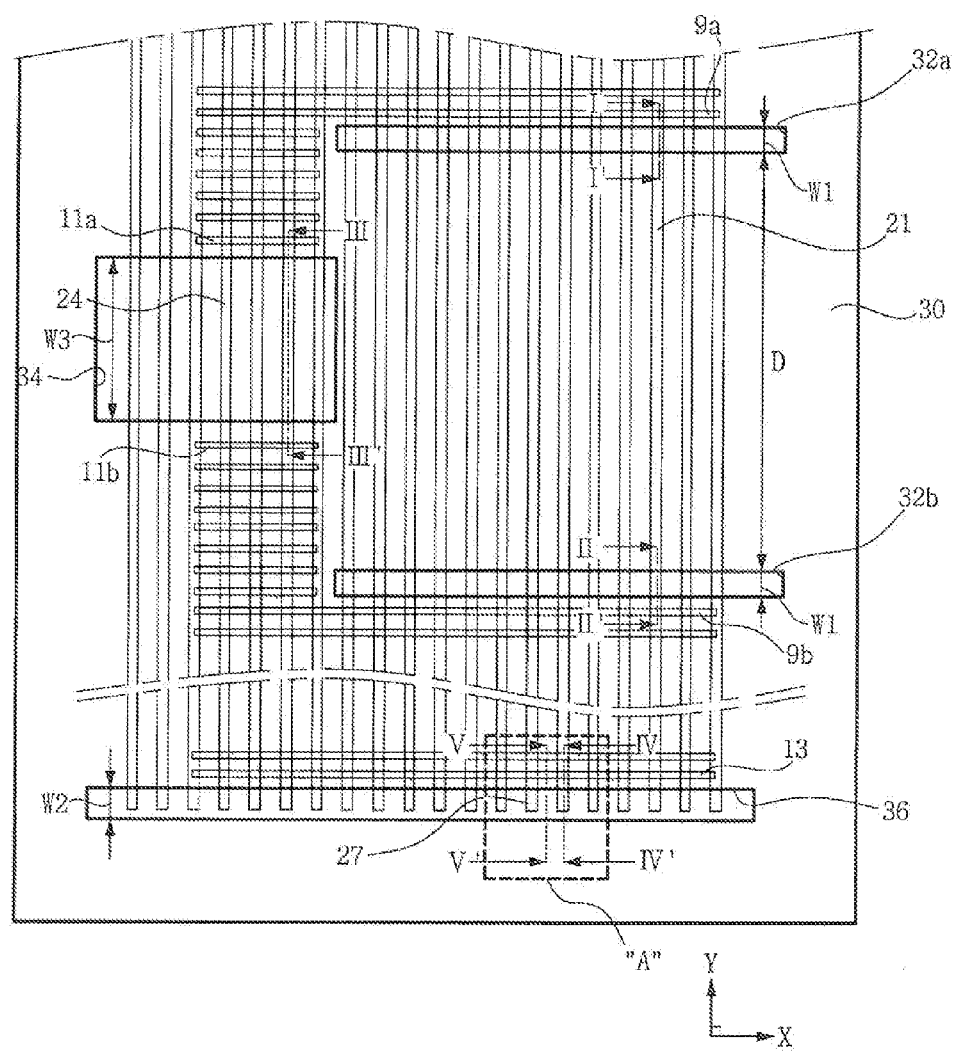
FIGS. 5B and 9B are enlarged views of parts of FIGS. 5A and 9A, respectively.
Figure 5B:
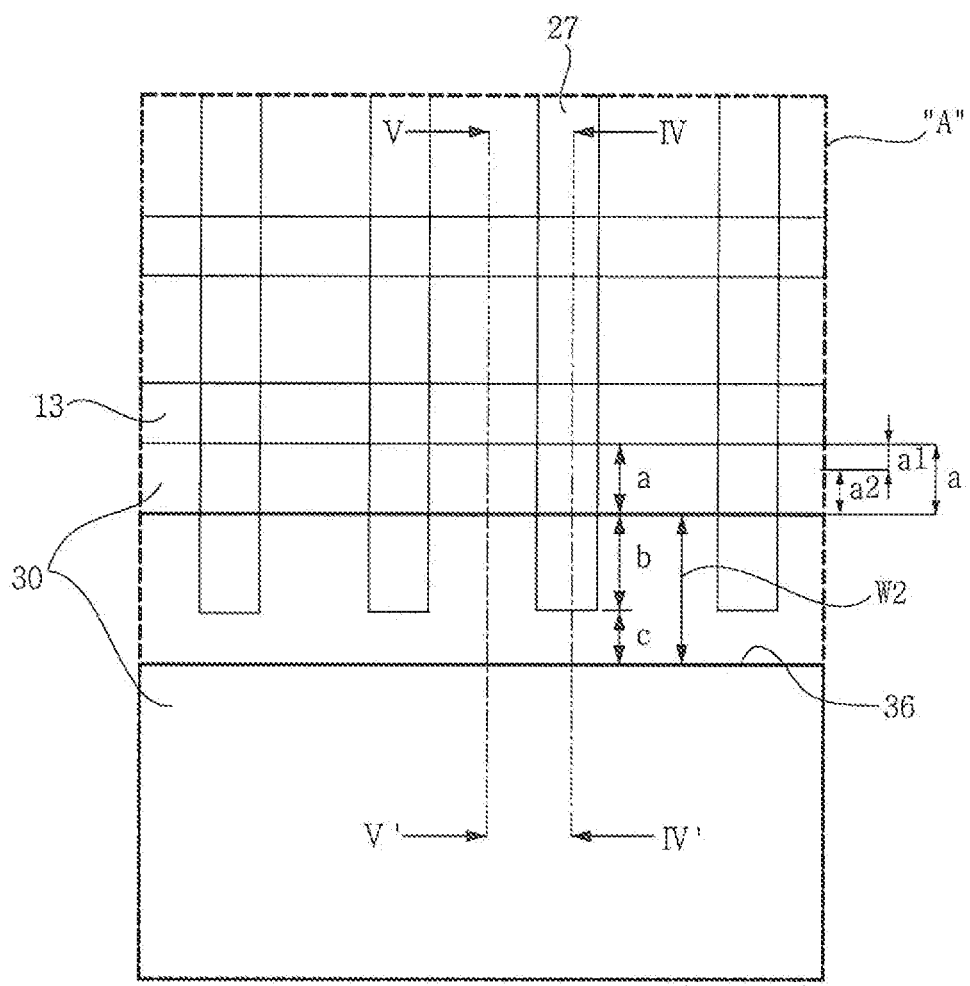
Figure 6A:
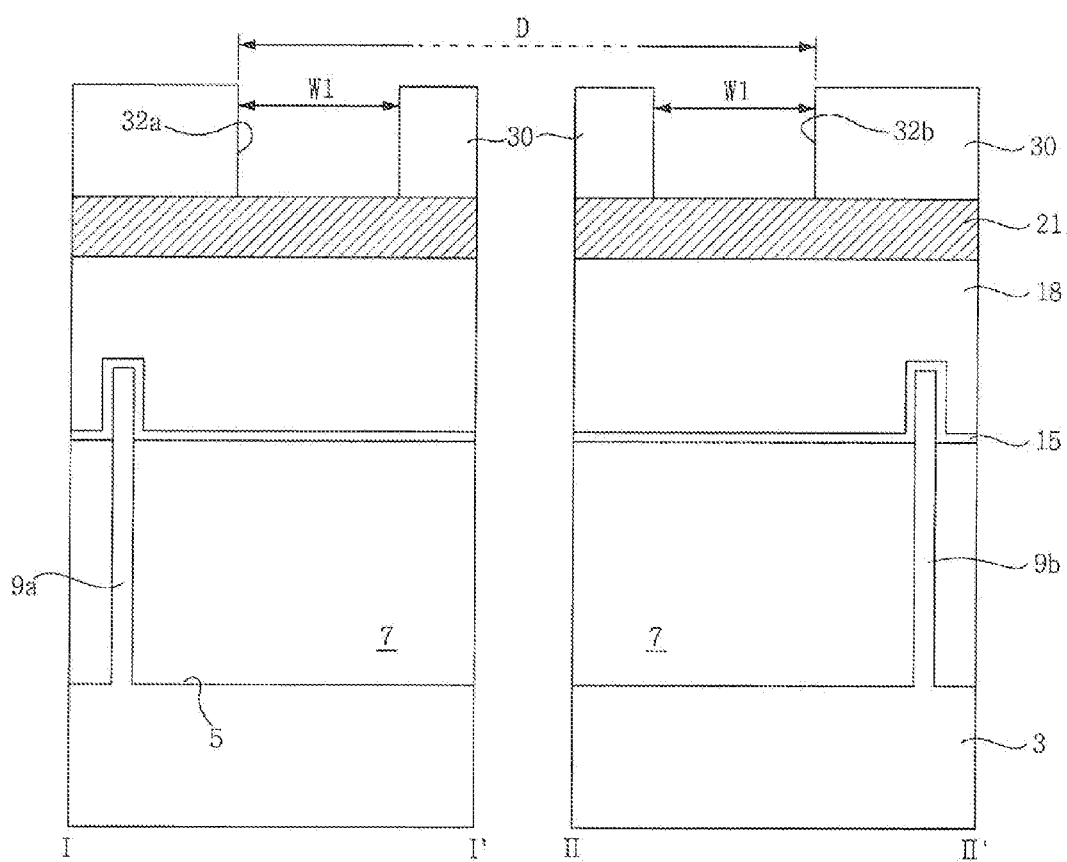
Figure 6B:
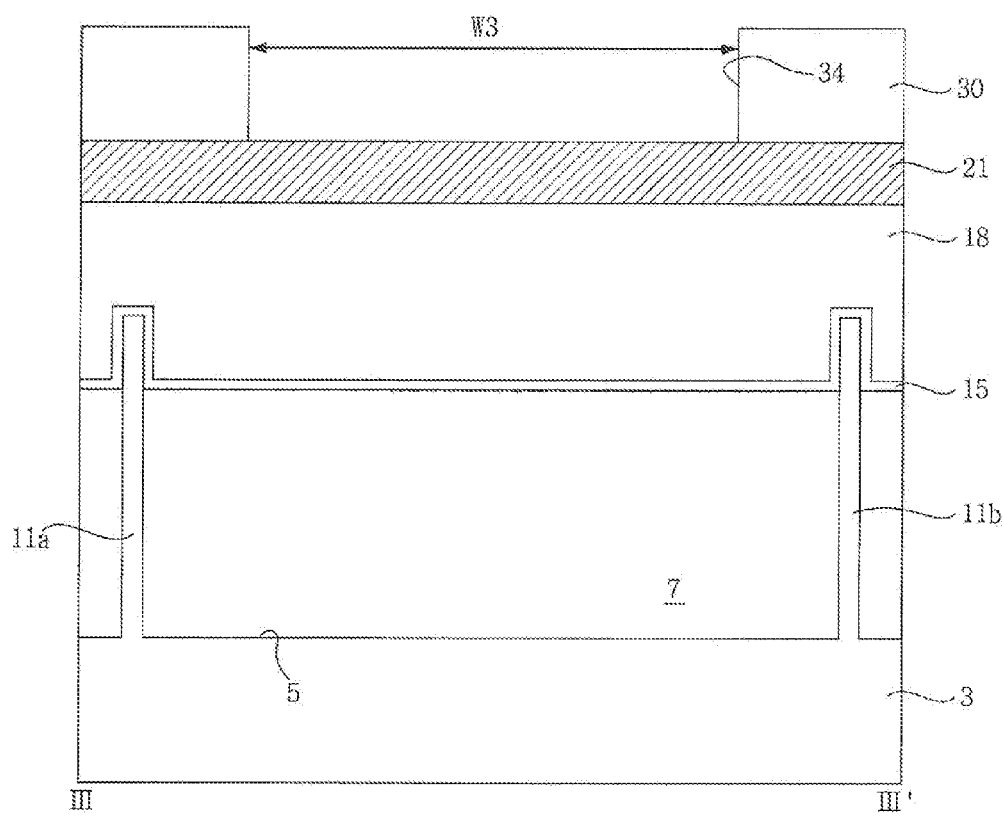
Figure 6C:
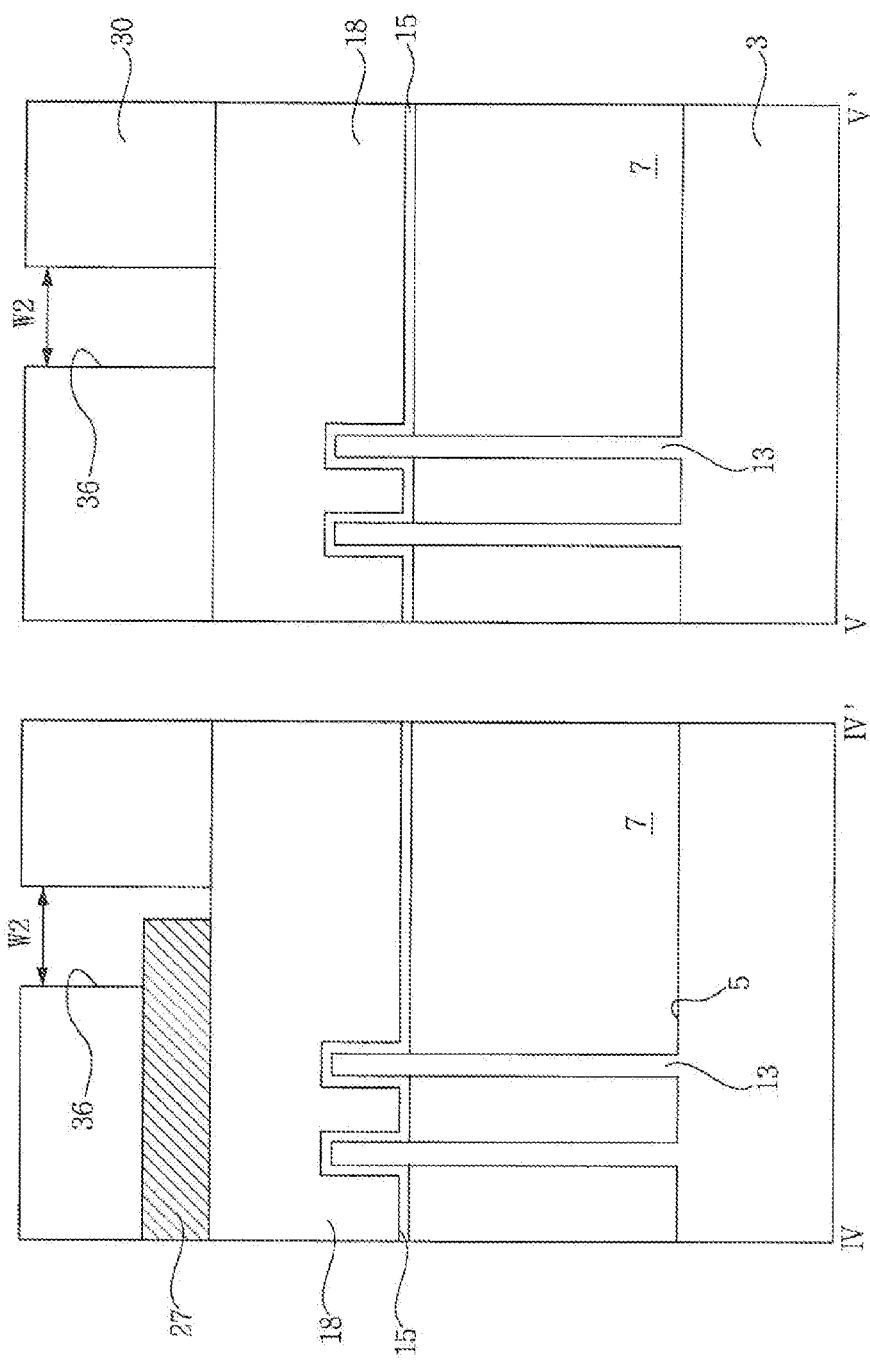
Figure 7:
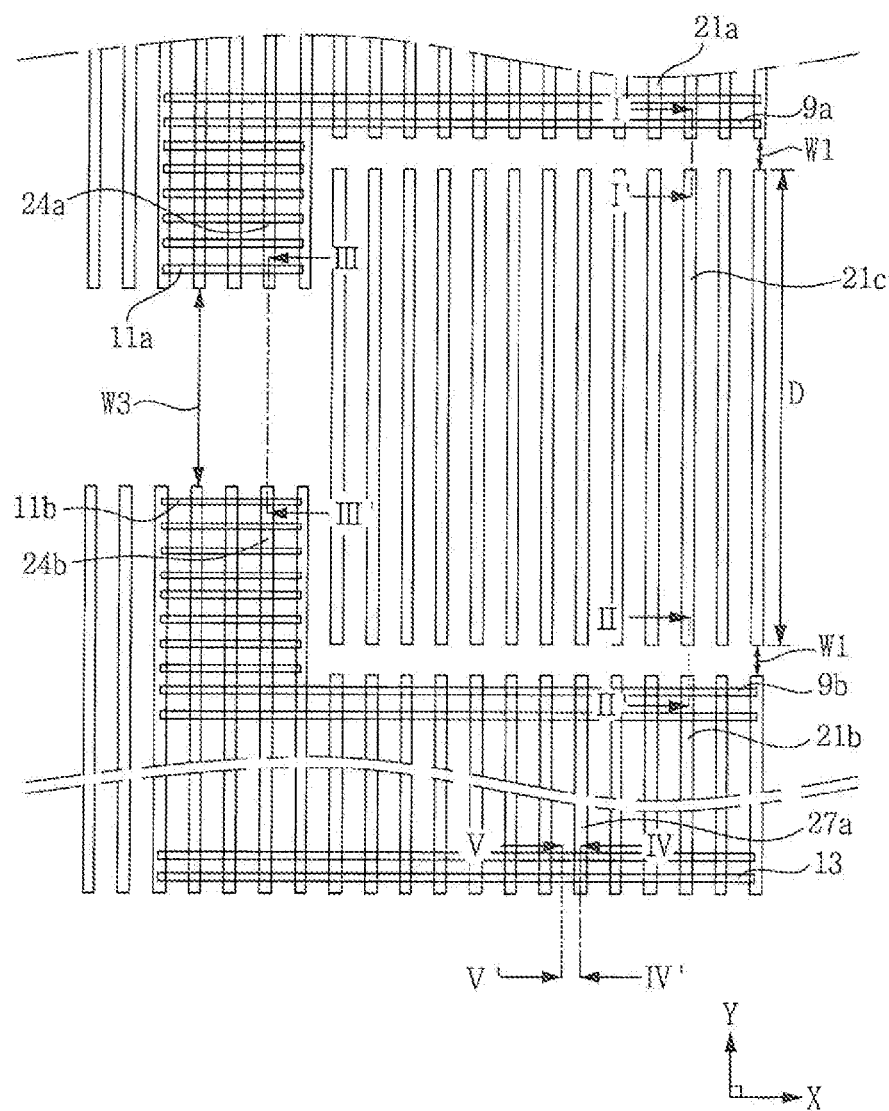
Figure 8A:
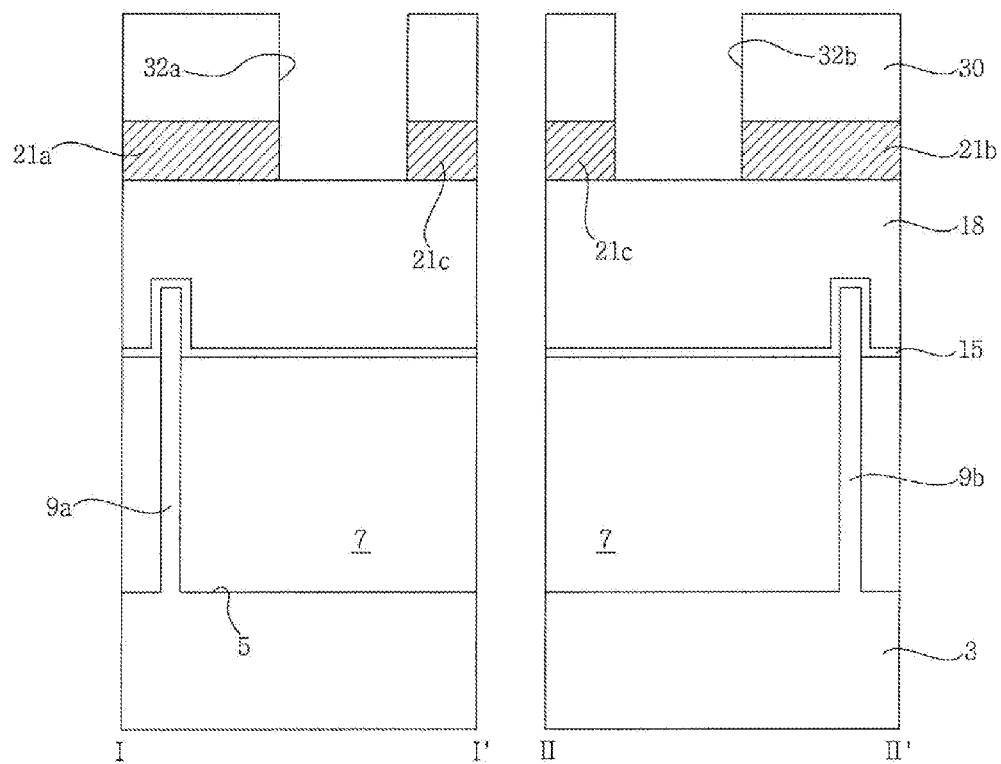
Figure 8B:
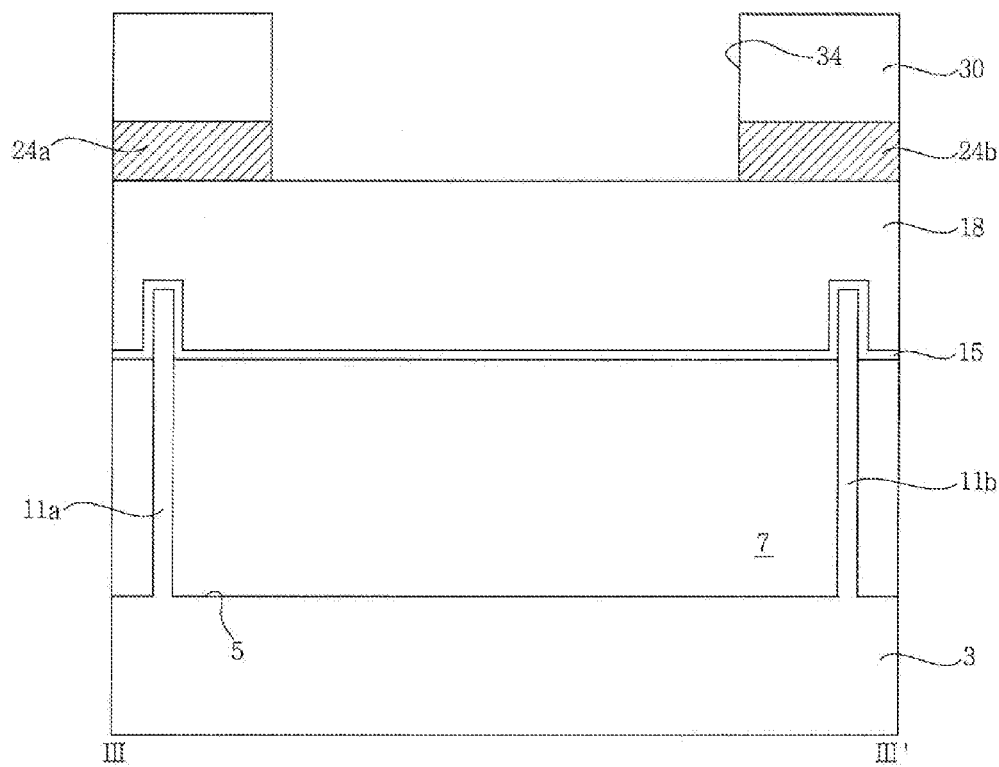
Figure 8C:
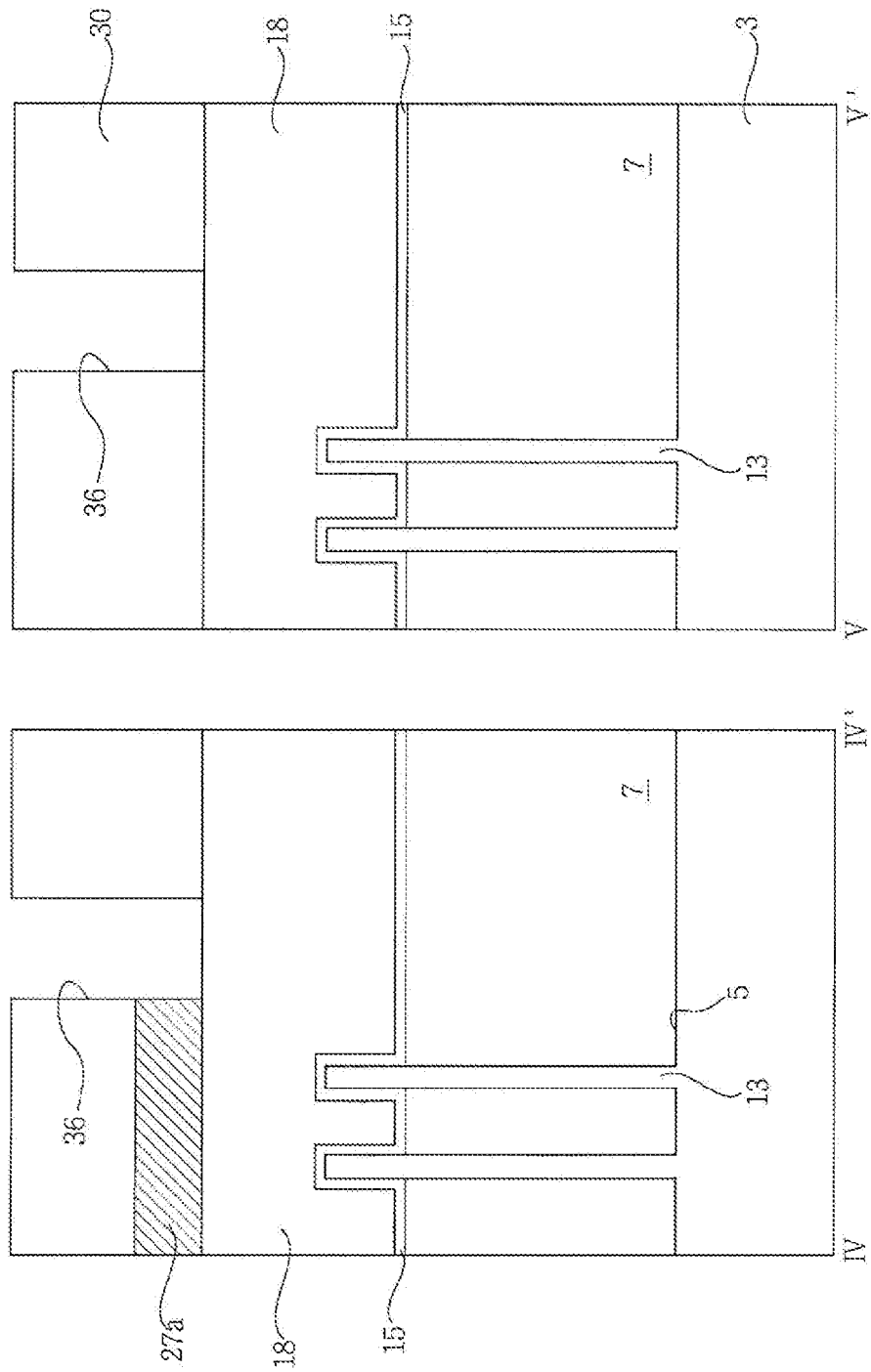
Figure 9A:
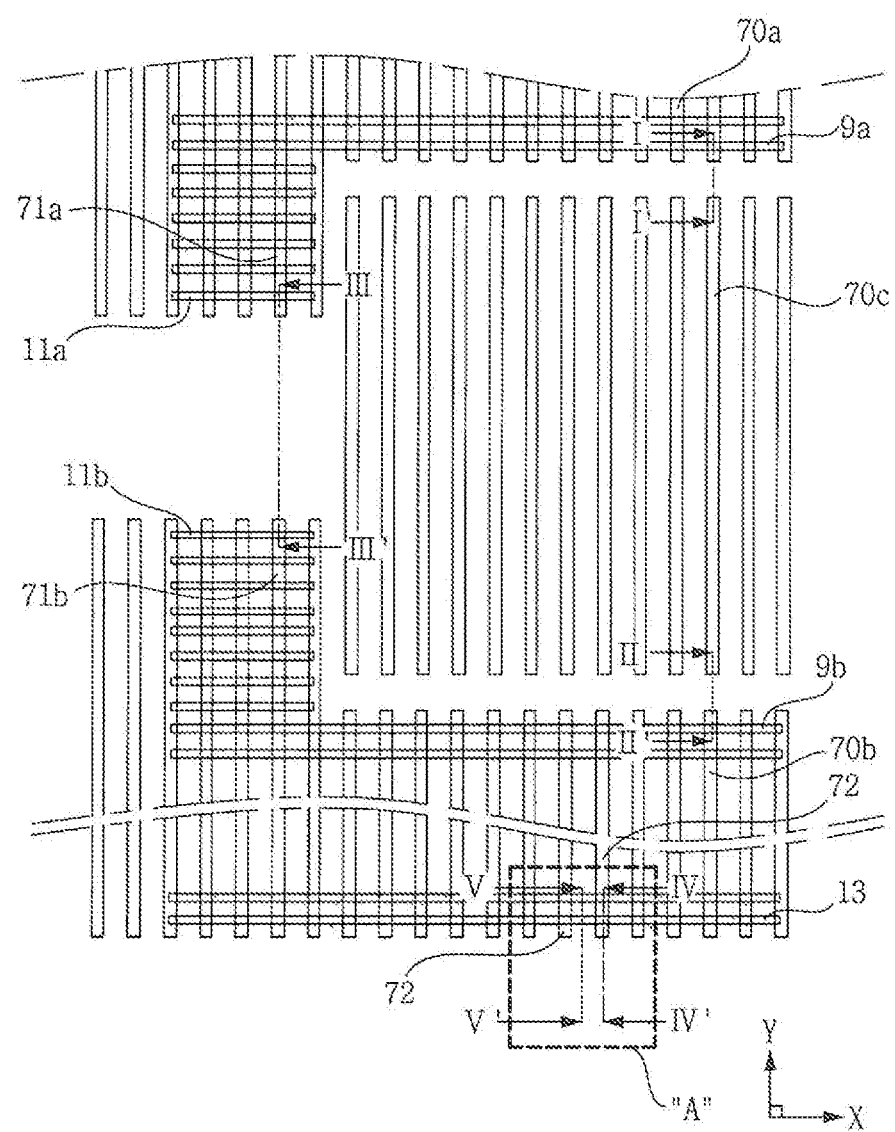
Figure 9B:
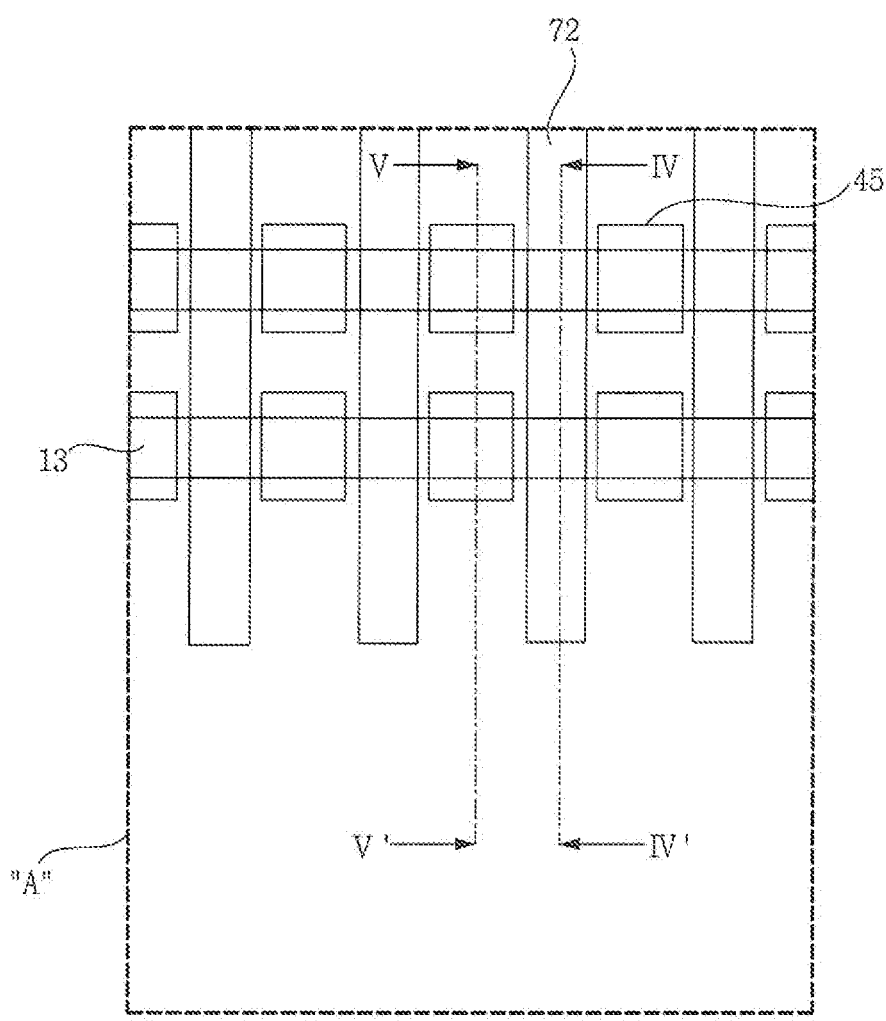
Figure 10A:
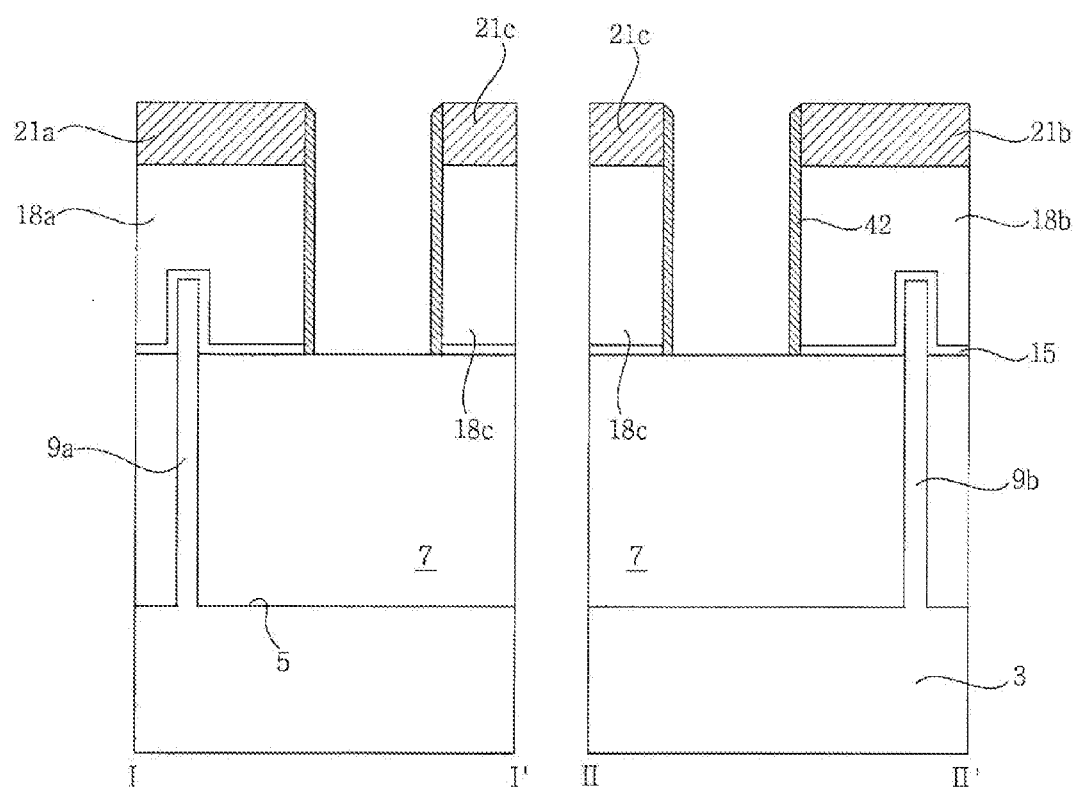
Figure 10B:
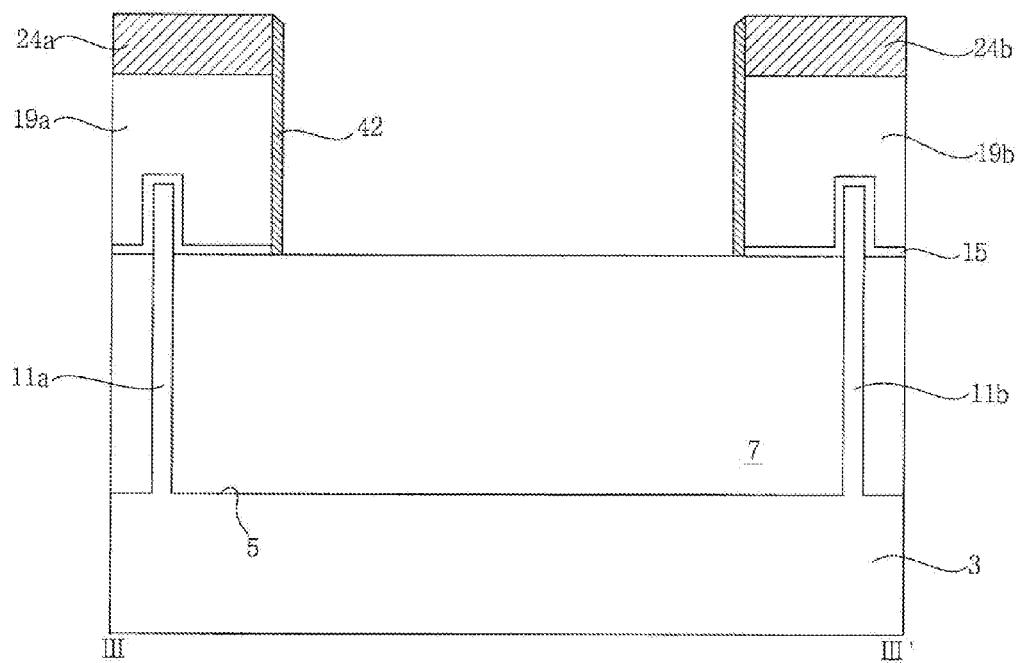
Figure 10C:
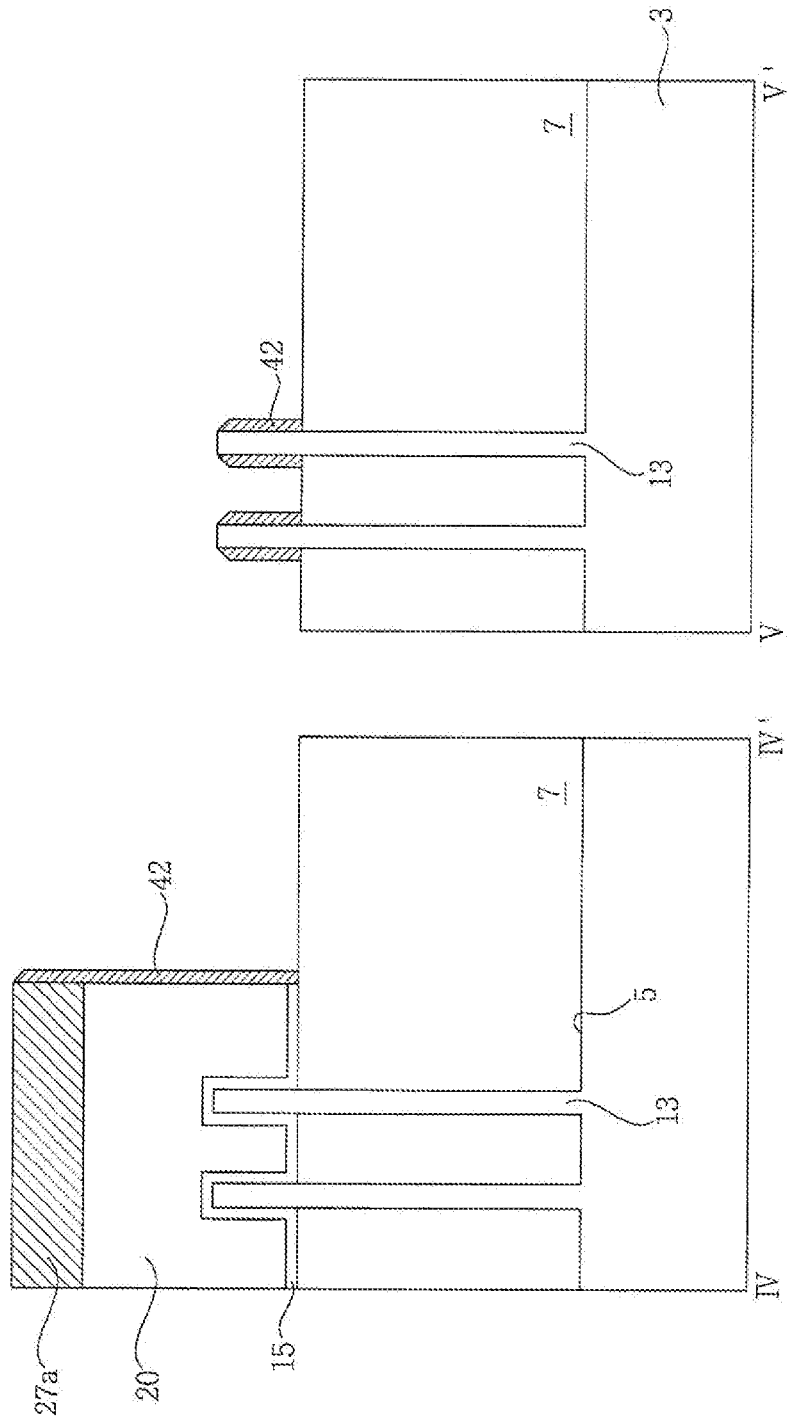
Figure 11A:
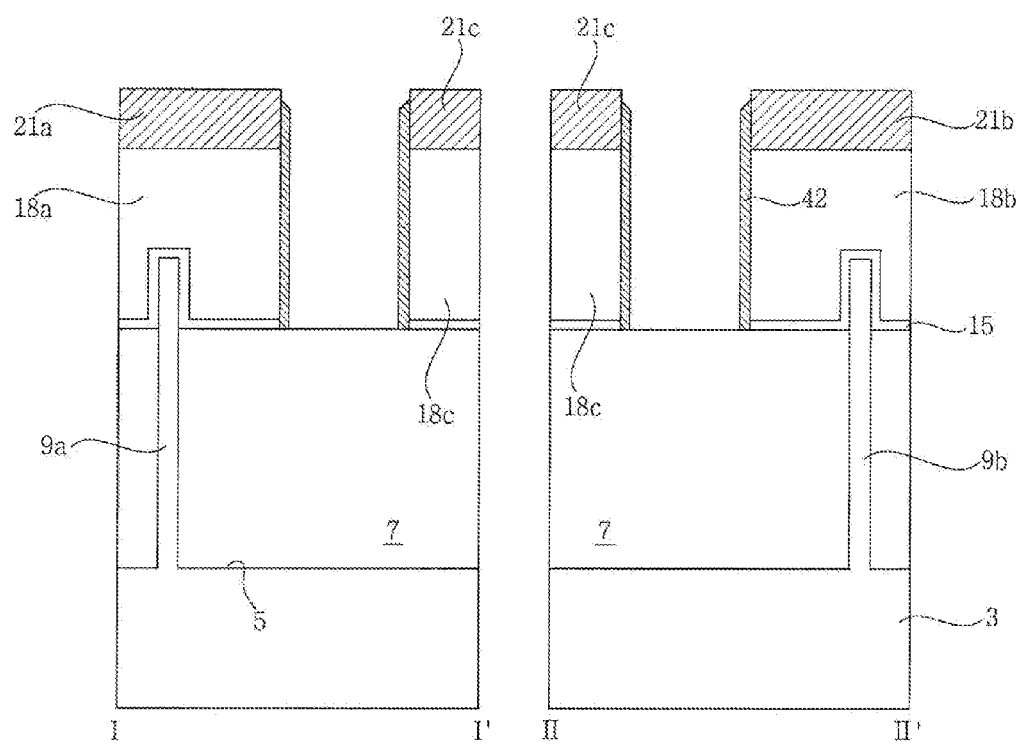
Figure 11B:
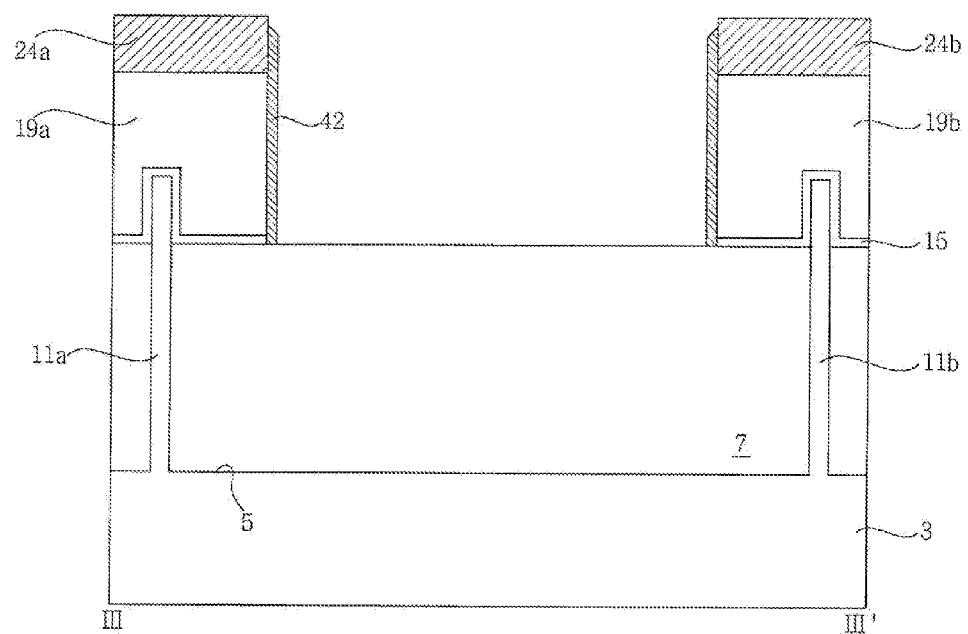
Figure 11C:
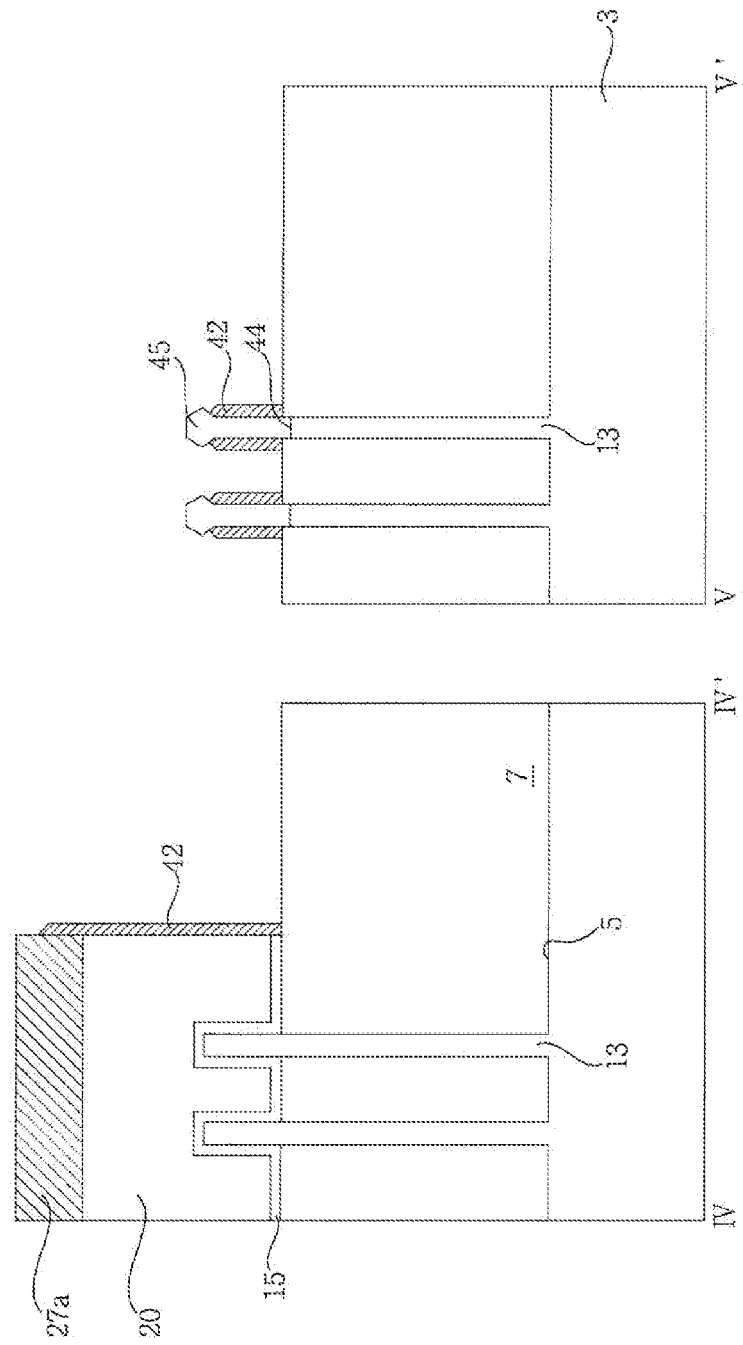
Figure 12A:
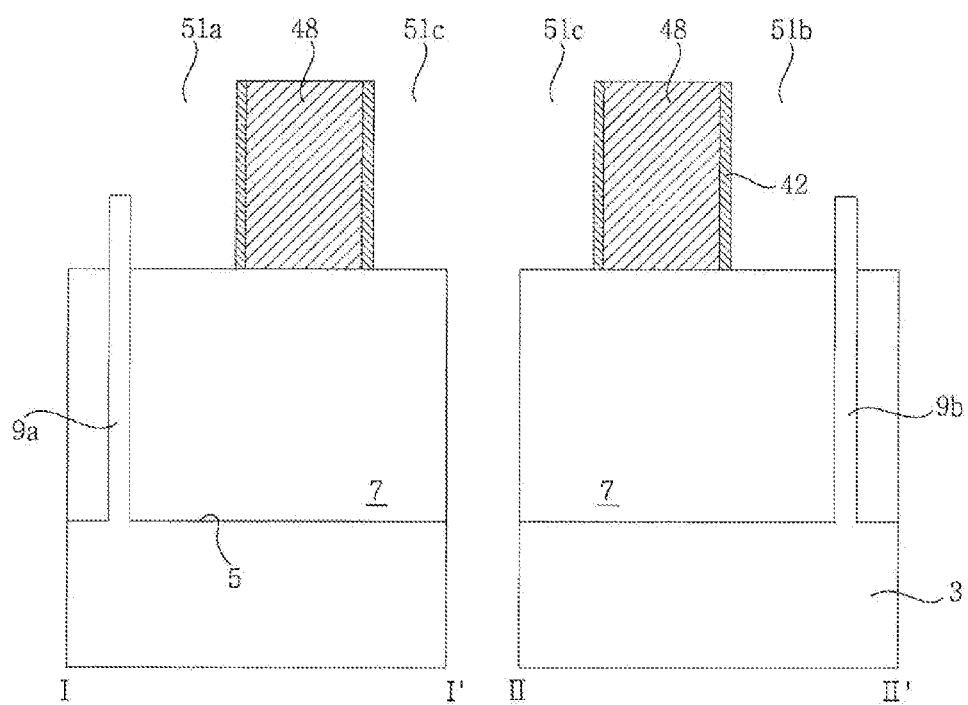
Figure 12B:
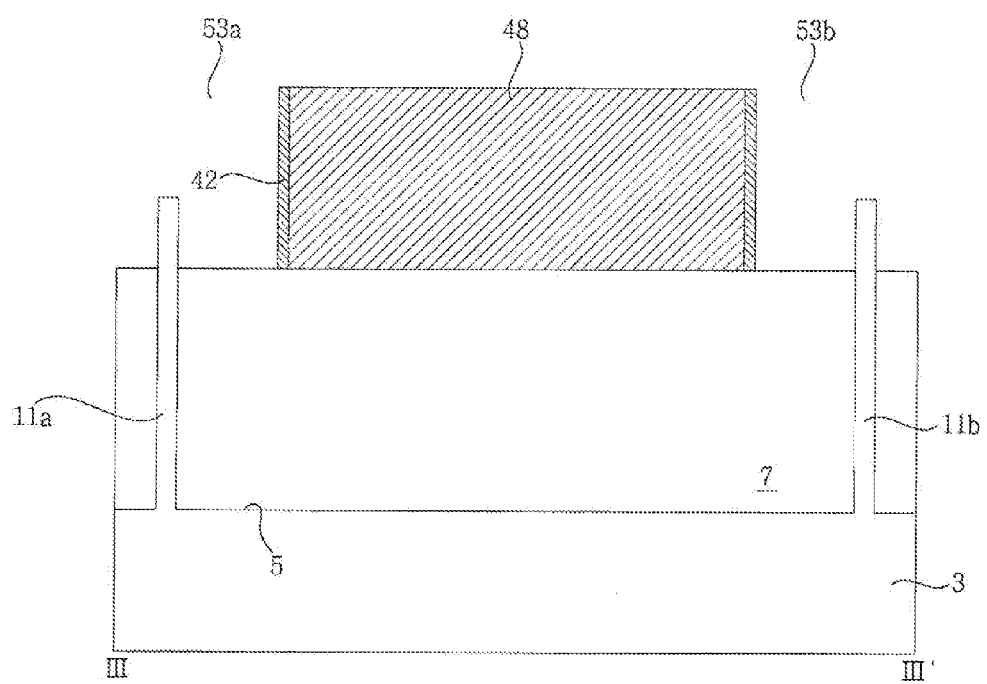

FIGS. 1 to 13C are views schematically illustrating intermediate process operations in methods of fabricating semiconductor devices in accordance with some embodiments of the inventive concepts. In FIGS. 1 to 13C, FIGS. 1, 3, 5A, 7, and 9A are plan views schematically illustrating intermediate process operations in methods of fabricating semiconductor devices in accordance with some embodiments of the inventive concepts, FIG. 5B is an enlarged view of a part "A" of FIG. 5A, FIG. 9B is an enlarged view of a part "A" of FIG. 9A, FIGS. 2A to 13A are cross-sectional views schematically illustrating areas taken along lines I-I' and II-II' of FIGS. 1, 3, 5A, 7, and 9A, FIGS. 2B to 13B are cross-sectional views schematically illustrating areas taken along line of FIGS. 1, 3, 5A, 7, and 9A, and FIGS. 2C to 13C are cross-sectional views schematically illustrating areas taken along lines IV-IV' and V-V' of FIGS. 1, 3, 5A, 7, and 9A.

Referring to FIGS. 1, 2A, 2B, and 2C, methods of fabricating semiconductor devices accordance with some embodiments of the inventive concepts may include forming an isolation region 7 that defines a plurality of fin active regions in a semiconductor substrate 3. In some embodiments,the semiconductor substrate 3 may be, for example, a single crystal silicon (Si) wafer or a SiGe wafer.

The plurality of fin active regions may extend in a first direction X and may be formed n line shapes that are parallel to each other. The plurality of fin active regions may include a first fin active region 9a and a second fin active region 9b that are spaced apart from each other, a third fin active region 11a and a fourth fin active region 11b that are spaced apart from each other, and an edge fin active region 13 that is an outermost one of the plurality of fin active regions in a second direction Y that is perpendicular to the first direction X. A distance L1 between the first and second fin active regions 9a and 9b may be greater than a distance L2 between the third and fourth fin active regions 11a and 11b.

The forming of the isolation region 7 may include forming a trench 5 in the semiconductor substrate 3 and partially filling the trench 5 with a trench insulating material. In some embodiments, the trench insulating material may include, for example, a silicon oxide based insulating material. An upper surface of the isolation region 7 may be formed at a level lower than upper surfaces of the plurality of fin active regions 9a, 9b, 11a, 11b, and 13. In other words, the plurality of fin active regions 9a, 9b, 11a, 11b, and 13 may protrude from the upper surface of the isolation region 7.

Referring to FIGS. 3, 4A, 413, and 4C, methods of fabricating semiconductor devices in accordance with some embodiments of the inventive concepts may include sequentially forming a base insulating layer 15, a sacrificial gate layer 18, and a plurality of hard mask lines.

The base insulating layer 15 may be conformally formed on surfaces of the plurality of fin active regions 9a, 9b, 11a, 11b, and 13 and the isolation region 7. In some embodiments, the base insulating layer 15 may include, for example, silicon oxide.

The sacrificial gate layer 18 may be formed on the base insulating layer 15, in me embodiments, the sacrificial gate layer 18 may include, for example, polysilicon.

The plurality of hard mask lines may be formed on the sacrificial gate layer 18. The plurality of hard mask lines may be formed in line shapes that extend in the second direction Y. The plurality of hard mask lines may be formed to have line shapes that cross ones of the plurality of fin active regions 9a, 9b, 11a, 11b, and 13.

The plurality of hard mask lines may include a first hard mask line 21 that crosses the first and second fin active regions 9a and 9b and extends over the isolation region 7, a second hard mask line 24 that crosses the third and fourth fin active regions 11a and 11b and extends over the isolation region 7, and an edge hard mask line 27 that crosses the edge fin active region 13 and extends over the isolation region 7.

The forming of the plurality of hard mask lines 21, 24, and 27 may include forming a hard mask layer on the sacrificial gate layer 18 and patterning the hard mask layer. In some embodiments, the plurality of hard mask lines 21, 24, and 27 may include, for example, silicon nitride.

Referring to FIGS. 5A, 5B, 6A, 6B, and 6C, methods of fabricating semiconductor devices in accordance with some embodiments of the inventive concepts may include forming a gate cut mask 30 having a plurality of gate cut openings on the semiconductor substrate 3 having the plurality of hard mask lines 21, 24, and 27. In some embodiments, the gate cut mask 30 may be formed using, for example, a photoresist pattern.

The plurality of gate cut openings of the gate cut mask 30 may include a first gate cut opening 32a, a second gate cut opening 32b, a third gate cut opening 34, and an edge gate cut opening 36. The plurality of gate cut openings may not overlap the plurality of fin active regions 9a, 9b, 11a, 11b, and 13.

The first and second gate cut openings 32a and 32b may each have a first width W1 that is the same and may be formed in line shapes that are parallel to each other. The first and second gate cut openings 32a and 32b may be formed on the sacrificial gate layer 18 between the first and second fin active regions 9a and 9b, and may expose respective portions of the first hard mask line 21 on the sacrificial gate layer 18 that are between the first and second fin active regions 9a and 9b.

The first gate cut opening 32a may be parallel to the first fin active region 9a, and adjacent to or close to the first fin active region 9a. The second gate cut opening 32b may be parallel to the second fin active region 9b, and adjacent to or close to the second fin active region 9b. In some embodiments, a distance D between the first and second gate cut openings 32a and 32b may be 20 times or greater than the first width W1.

In some embodiments, the first width W1 may be a minimum width that may be formed according to a resolution limit of a photolithography device for forming the gate cut mask 30 using a photoresist pattern.

The edge gate cut opening 36 may be formed in a line shape parallel to the first and second gate cut openings 32a and 32b. The edge gate cut opening 36 may be parallel to the edge in active region 13 and adjacent to or close to the edge fin active region 13. The edge gate cut opening 36 may expose an end portion of the edge hard mask line 27.

The edge gate cut opening 36 may be formed to have a second width W2 that is greater than the first width W1. The second width W2 of the edge gate cut opening 36 may be greater than the first width W1 but smaller than twice the size of the first width W1.

The edge gate cut opening 36 may have a first side wall and a second side wall that are each parallel to the edge fin active region 13 and that face each other. The first side wall of the edge gate cut opening 36 may overlap the edge hard mask line 27 and the second side wall of the edge gate cut opening 36 may not overlap the edge hard mask line 27.

A distance b between the first side wall of the edge gate cut opening 36 and the end portion of the edge hard mask line 27 may be greater than a distance c between the second side wall of the edge gate cut opening 36 and the end portion of the edge hard mask line 27. In some embodiments, the distance b between the first side wall of the edge gate cut opening 36 and the end portion of the edge hard mask line 27 may be substantially the same as the first width W1 of each of the first and second gate cut openings 32a and 32b.

The third gate cut opening 34 may be formed on the sacrificial gate layer 18 between the third and fourth fin active regions 11a and 11b and may expose a portion of the second hard mask line 24 on the sacrificial gate layer 18 that is between the third and fourth fin active regions 11a and 11b. The third gate cut opening 34 may be formed to have a third width W3 that is smaller than a sum of twice the size of the first width W1 and 20 times the size of the first width W1. In other words, the third width W3 of the third gate cut opening 34 may be smaller than the distance D between the first and second gate cut openings 32a and 32b.

In some embodiments, each of a distance between the first gate cut opening 32a and the first fin active region 9a, a distance between the second gate cut opening 32b and the second fin active region 9b, a distance between the third gate cut opening 34 and the third fin active region 11a, a distance between the third gate cut opening 34 and the fourth fin active region 11b, and a distance between the edge gate cut opening 36 and the edge fin active region 13 may be equal to each other. For example, a distance a between the edge gate cut opening 36 and the edge fin active region 13 may be determined by a size a1 of a semiconductor layer 45 (see FIG. 9B) formed on the edge fin active region 13 using a selective epitaxial growth (SEG) process, and a size a2 considering a process margin. For example, the process margin may be determined by considering the allowable errors of misalignment in a photolithograph process, the allowable errors in an etching process, the allowable errors in an SEG process, etc.

The distance a between the edge gate cut opening 36 and the edge fin active region 13 may be smaller than the second width W2 of the edge gate cut opening 36.

Referring to FIGS. 7, 8A, 8B, and 8C, methods of fabricating semiconductor devices in accordance with some embodiments of the inventive concepts may include etching the plurality of hard mask lines 21, 24, and 27 using the gate cut mask 30 as an etch mask to form a plurality of hard mask patterns.

The plurality of hard mask patterns may include a first hard mask pattern 21a that crosses the first fin active region 9a, a second hard mask pattern 21b that crosses the second fin active region 9b, an intermediate hard mask pattern 21c that is between the first and second hard mask patterns 21a and 21b, a third hard mask pattern 24a that crosses the third fin active region 11a, a fourth hard mask pattern 24b that crosses the fourth fin active region 11b, and an edge hard mask pattern 27a that crosses the edge fin active region 13.

Each of a distance between the first hard mask pattern 21a and the intermediate hard mask pattern 21c and a distance between the second hard mask pattern 21b and the intermediate hard mask pattern 21c may be the same as the first width W1 of each of the first and second gate cut openings 32a and 32b. Further, a length of the intermediate hard mask pattern 21c may be the same as the distance D between the first and second gate cut openings 32a and 32b. Therefore, the length D of the intermediate hard mask pattern 21c may be 20 times or greater the size of the distance W1 between the first hard mask pattern 21a and the intermediate hard mask pattern 21c.

A distance between the third and fourth hard mask patterns 24a and 24b may be the same as the third width W3 of the third gate cut opening 34. The distance W3 between the third and fourth hard mask patterns 24a and 24b may be smaller than the length D of the intermediate hard mask pattern 21c. The distance W3 between the third and fourth hard mask patterns 24a and 24b may be smaller than a sum of twice the size of the distance W1 between the first hard mask pattern 21a and the intermediate hard mask pattern 21c and 20 times the size of the distance W1 between the first hard mask pattern 21a and the intermediate hard mask pattern 21c.

After the plurality of hard mask patterns are formed, the gate cut mask 30 may be removed.

Referring to FIGS. 9A, 9B, 10A, 10B, and 10C, methods of fabricating the semiconductor devices in accordance with some embodiments of the inventive concepts may include etching the sacrificial gate layer 18 using the hard mask patterns 21a, 21b, 21c, 24a, 24b, and 27a as etch masks, forming a plurality of sacrificial gate patterns. The methods may further include forming gate spacers 42.

The plurality of sacrificial gate patterns may include a first sacrificial gate pattern 18a, a second sacrificial gate pattern 18b, an intermediate sacrificial gate pattern 18c, a third sacrificial gate pattern 19a and a fourth sacrificial gate pattern 19b, and an edge sacrificial gate pattern 20.

The first sacrificial gate pattern 18a may be aligned under the first hard mask pattern 21a, the second sacrificial gate pattern 18b may be aligned under the second hard mask pattern 21b, the intermediate sacrificial gate pattern 18c may be aligned under the intermediate hard mask pattern 2c, the third sacrificial gate pattern 19a may be aligned under the third hard mask pattern 24a, the fourth sacrificial gate pattern 19b may be aligned under the fourth hard mask pattern 24b, and the edge sacrificial gate pattern 20 may be aligned under the edge hard mask pattern 27a.

In some embodiments, the sacrificial gate layer 18 may be etched using the hard mask patterns 21a, 21b, 21c, 24a, 24b, and 27a as etch masks, and then the base insulating layer 15 may be etched.

The gate spacers 42 may be formed on side surfaces of the sacrificial gate patterns 18a, 18b, 18c, 19a, 19b, and 20, side surfaces of the hard mask patterns 21a, 21b, 21c, 24a, 24b, and 27a, and side surfaces of protruding parts of the fin active regions 9a, 9b, 11a, 11b, and 13. The gate spacers 42 may be formed of an insulating material (e.g., silicon nitride).

Referring to FIGS. 9A, 9B, 11A, 11B, and 11C, methods of fabricating the semiconductor devices in accordance with some embodiments of the inventive concepts may include forming semiconductor layers 45.

The forming of the semiconductor layers 45 may include etching portions of the fin active regions 9a, 9b, 11a, 11b, and 13 using the hard mask patterns 21a, 21b, 21c, 24a, 24b, and 27a, and the gate spacers 42 as etch masks, forming active recessed regions 44, and performing an epitaxial growth process.

The semiconductor layers 45 may have upper surfaces, upon filling the active recessed regions 44, that are located at a level higher than upper surfaces of the fin active regions 9a, 9b, 11a, 11b, and 13. In some embodiments, the semiconductor layers 45 may be formed of for example, silicon germanium (SiGe) or silicon (Si) using an epitaxial growth process. The semiconductor layers 45 may have widths greater than the fin active regions 9a, 9b, 11a, 11b, and 13 in parts protruding more than the upper surfaces of the fin active regions 9a, 9b, 11a, 11b, and 13.

Referring to FIGS. 9A, 9B, 12A, 12B, and 12C, methods of fabricating the semiconductor devices in accordance with some embodiments of the inventive concepts may include forming a planarized interlayer insulating layer 48 and forming a plurality of gate trenches.

The forming of the planarized interlayer insulating layer 48 may include forming an interlayer insulating layer on portions of the semiconductor substrate 3 having the semiconductor layers 45, and exposing the sacrificial gate patterns 18a, 18b, 19a, 19b, and 20 by performing a planarization process. In some embodiments, the planarization process may include a chemical mechanical polishing process. The planarized interlayer insulating layer 48 may be formed on the side surfaces of the sacrificial gate patterns 18a, 18b, 18c, 19a, 19b, and 20.

The hard mask patterns 21a, 21b, 21c, 24a, 24b, and 27a may be removed during the performing the planarization process, and/or after the performing the planarization process.

The forming of the plurality of gate trenches may include etching and removing the sacrificial gate patterns 18a, 18b, 18c, 19a, 19b, and 20 and the base insulating layer 15 using the planarized interlayer insulating layer 48 and the gate spacers 42 as etch masks.

The gate trenches may include a first gate trench 51a, a second gate trench 51b, an intermediate gate trench 51c, a third gate trench 53a, a fourth gate trench 53b, and an edge gate trench 55.

The first gate trench 51a may be formed by etching the first sacrificial gate pattern 18a and the base insulating layer 15 under the first sacrificial gate pattern 18a, and may expose the first fin active region 9a. The second gate trench 51b may be formed by etching the second sacrificial gate pattern 18b and the base insulating layer 15 under the second sacrificial gate pattern 18b, and may expose the second fin active region 9b. The intermediate gate trench 51c may be formed by etching the intermediate sacrificial gate pattern 18c and the base insulating layer 15 under the intermediate sacrificial gate pattern 18c, may not overlap the plurality of fin active regions, and may expose the isolation region 7. The third gate trench 53a may be formed by etching the third sacrificial gate pattern 19a and the base insulating layer 15 under the third sacrificial gate pattern 19a, and may expose the third fin active region 11a. The fourth gate trench 53b may be formed by etching the fourth sacrificial gate pattern 19b and the base insulating layer 15 under the fourth sacrificial gate pattern 19b, and may expose the fourth fin active region 11b. The edge gate trench 55 may be formed by etching the edge sacrificial gate pattern 20 and the base insulating layer 15 under the edge sacrificial gate pattern 20, and may expose the edge fin active region 13.

Figure 13A:
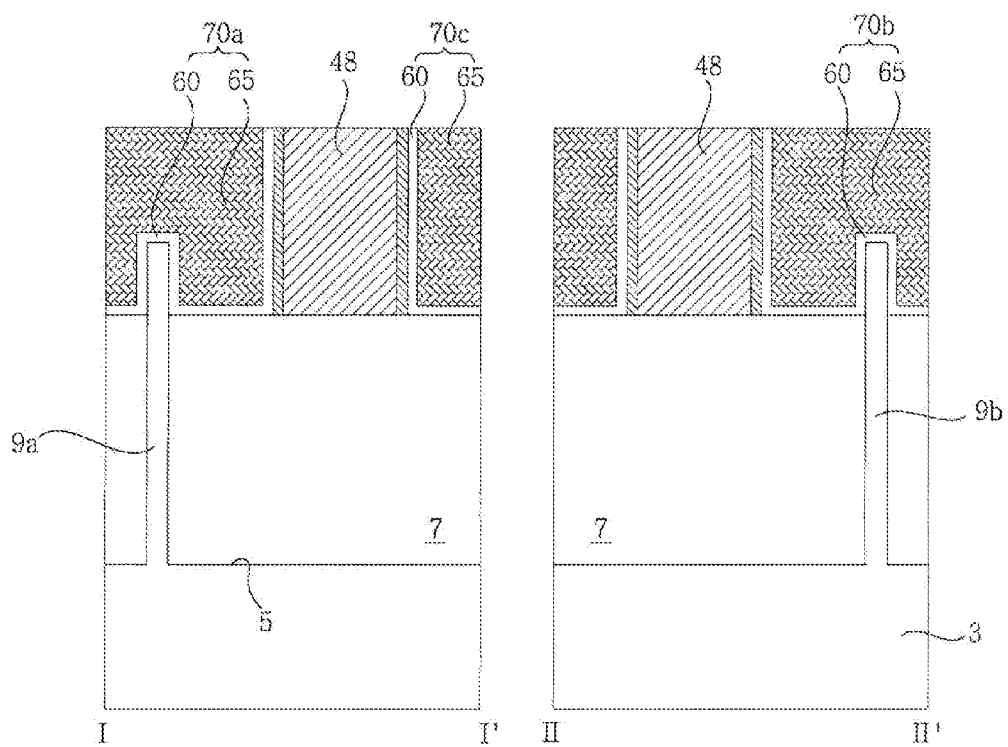
Figure 13B:
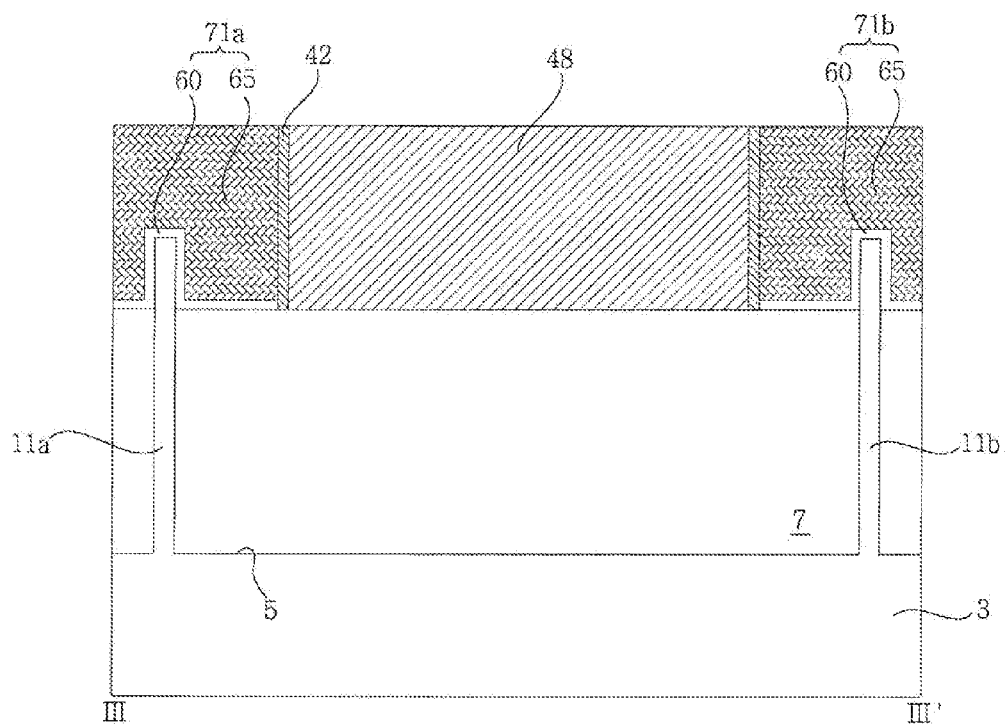
Figure 13C:
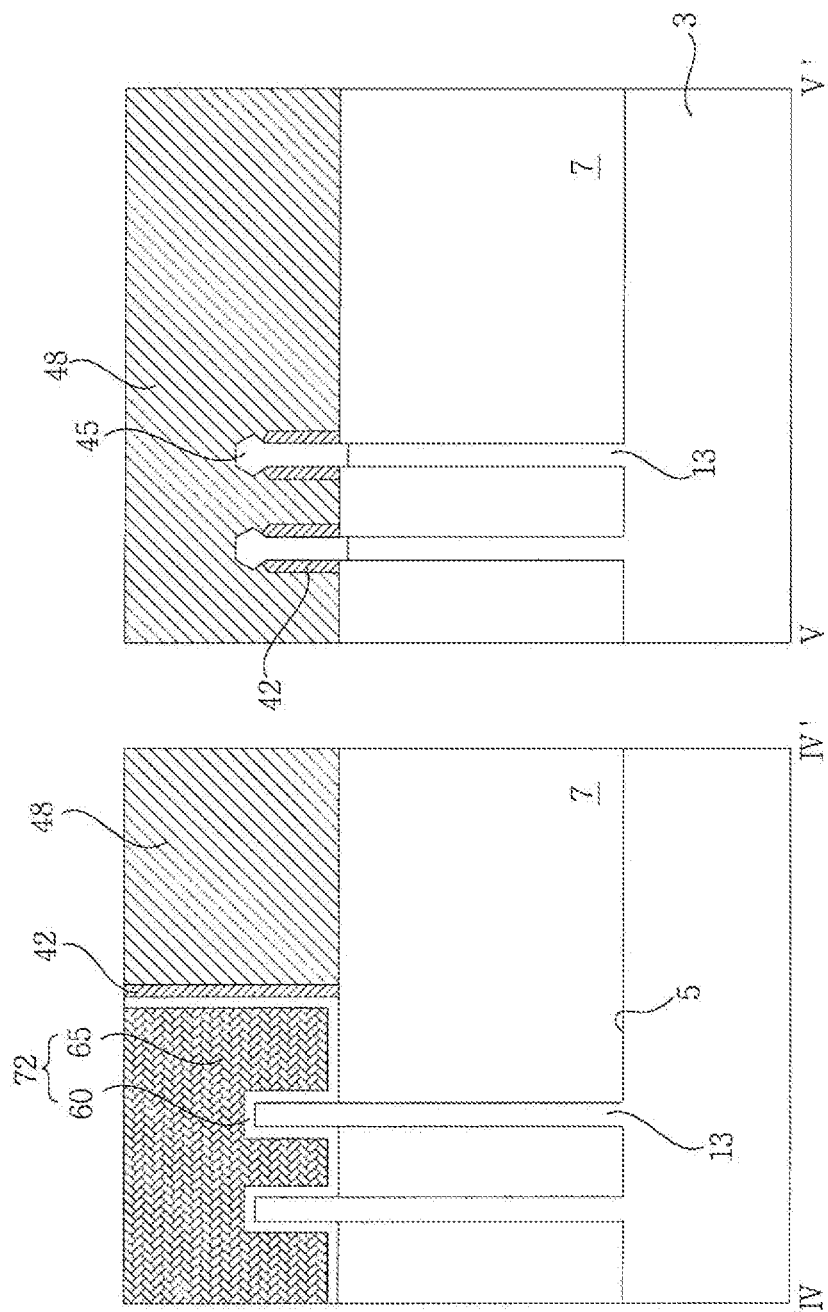

Referring to FIGS. 13A, 13B, and 13C, methods of fabricating the semiconductor devices in accordance with some embodiments of the inventive concepts may include forming a plurality of gate structures 70a, 70b, 70c, 71a, 71b, and 72 that fill the plurality of gate trenches 51a, 51b, 51c, 53a, 53b, and 55, respectively.

Each of the plurality of gate structures 70a, 70b, 70c, 71a, 71b, and 72 may include a gate dielectric 60 and a gate electrode 65. The gate dielectric 60 may surround side surfaces and a bottom of the gate electrode 65. In some embodiments, the gate dielectric 60 may include a higk-k dielectric layer capable of being formed using a deposition process. In some embodiments, the gate electrode 65 may include a conductive material, for example, a metal nitride (e.g., TiN, WN, or the like), and/or a metal material (e.g., W, or the like).

The plurality of gate structures 70a, 70b, 70c, 71a, 71b, and 72 may include a first gate structure 70a that fills the first gate trench 51a, a second gate structure 70b that fills the second gate trench 51b, an intermediate gate structure 70c that fills the intermediate gate trench 51c, a third gate structure 71a that fills the third gate trench 53a, a fourth gate structure 71b that fills the fourth gate trench 53b, and an edge gate structure 72 that fills the edge gate trench 55.

The first gate structure 70a may cross the first fin active region 9a, the second gate structure 70b may cross the second fin active region 9b, the third gate structure 71a may cross the third fin active region 11a, the fourth gate structure 71b may cross the fourth fin active region 11b, and the edge gate structure 72 may cross the edge fin active region 13. The intermediate gate structure 70c may be formed between the first and second gate structures 70a and 70b and on the isolation region 7. The intermediate gate structure 70c may not overlap the plurality of fin active regions.

The methods of fabricating the semiconductor devices in accordance with some embodiments of the inventive concepts may provide methods of preventing an occurrence of nodule defects. As described with reference to FIGS. 5A, 5B, 6A, 6B, and 6C, the process may be performed using the gate cut mask 30 having the gate cut openings 32a, 32b, 34, and 36, and thus yield of the semiconductor devices may be improved and productivity may be improved. For example, the edge gate cut opening 36 (shown in FIGS. 5A and 5B) may reduce nodule defects generated on side surfaces of an end portion of the edge sacrificial gate pattern 20 during an SEG process for forming the semiconductor layers 45. Further, the first and second gate cut openings 32a and 32b (shown in FIGS. 5A and 5B) may reduce nodule defects generated on side surfaces of ends of the first and second sacrificial gate patterns 18a and 18b during the SEG process for forming the semiconductor layers 45. Furthermore, the intermediate hard mask pattern 21c may reduce nodule defects generated on side surfaces of ends of the third and fourth sacrificial gate patterns 19a and 19b located adjacent to the intermediate hard mask pattern 21c during the SEG process for forming the semiconductor layers 45. Therefore, the defects may be reduced, and thus productivity may he improved.

Figure 14A:
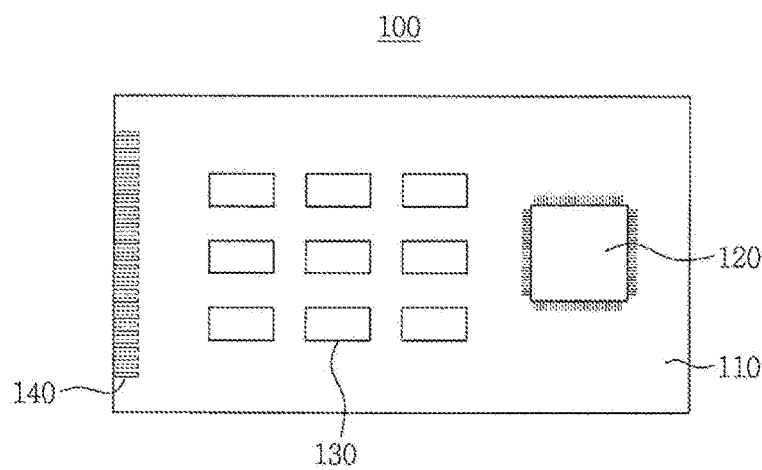
FIG. 14A is a plan view schematically illustrating a semiconductor module according to some embodiments of the inventive concepts.

FIG. 14A is a plan view schematically illustrating a semiconductor module in accordance with some embodiments of the inventive concepts. Referring to FIG. 14A, a semiconductor module 100 may include a processor 120 and semiconductor devices 130 that are mounted on a module substrate 110. Conductive input/output terminals 140 may be disposed on at least one side of the module substrate 110.

The processor 120 and/or the semiconductor devices 130 may include semiconductor devices formed according to the methods of fabricating semiconductor devices in accordance with some embodiments of the inventive concepts.

Figure 14B:
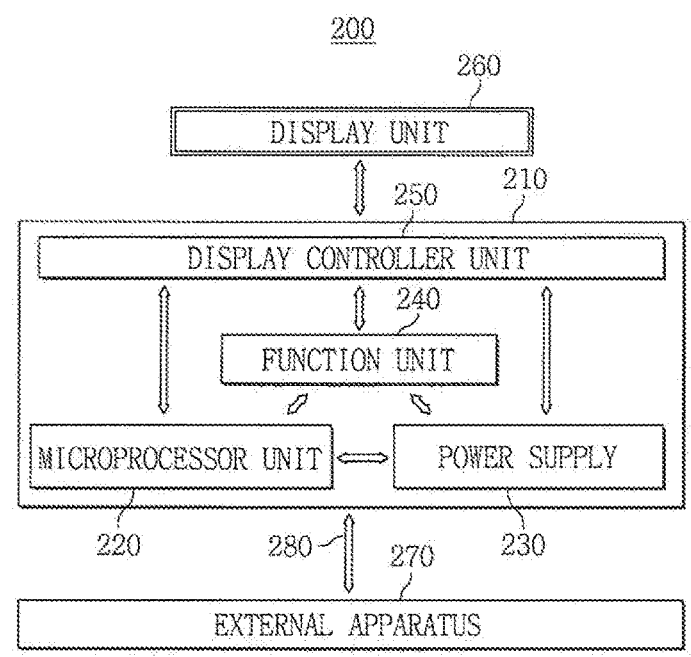
FIGS. 14B and 14C are block diagrams schematically illustrating electronic systems according to some embodiments of the inventive concepts.
Figure 14C:
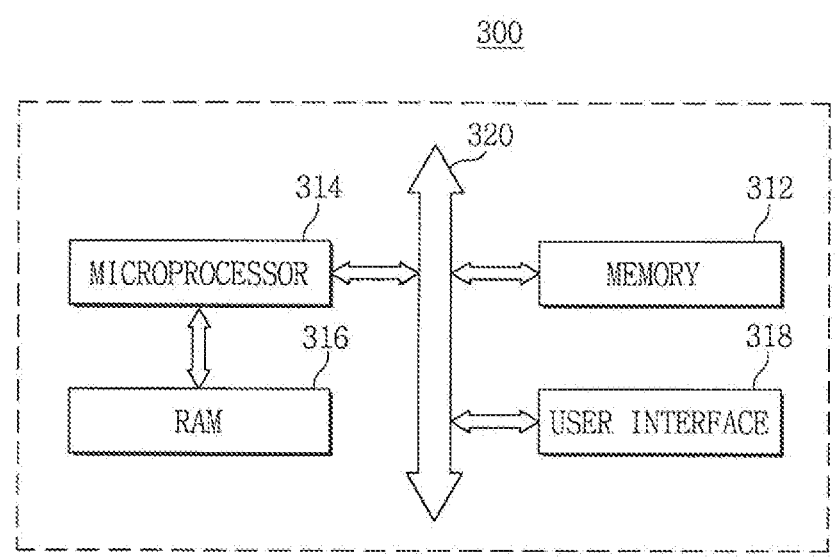

FIGS. 14B and 14C are block diagrams schematically illustrating electronic systems according to some embodiments of the inventive concepts.

Referring to FIG. 1413, an electronic system 200 may include a body 210, a display unit 260, and an external apparatus 270. The body 210 may include a microprocessor unit 220, a power supply 230, a function unit 240, and/or a display controller unit 250. The body 210 may include a system board or a motherboard having a PCB or the like, and/or a case. The microprocessor unit 220, the power supply 230, the function unit 240, and the display controller unit 250 may be mounted or disposed on an upper surface of the body 210 or inside the body 210. The display unit 260 may be disposed on the upper surface of the body 210 or inside/outside the body 210. The display unit 260 may display an image processed by the display controller unit 250. For example, the display unit 260 may include a liquid crystal display (LCD), an active matrix organic light emitting diode (AMOLED), or various display panels. The display unit 260 may include a touch screen. Therefore, the display unit 260 may have an input/output function. The power supply 230 may supply a current and/or a voltage to the microprocessor unit 220, the function unit 240, the display controller unit 250, etc. The power supply 230 may include a charging battery, a socket for a dry cell, or a voltage/current converter. The microprocessor unit 220 may receive a voltage from the power supply 230 to control the function unit 240 and the display unit 260. For example, the microprocessor unit 220 may include a CPU or an application processor (AP). The function unit 240 may include a touch pad, a touch screen, a volatile/non-volatile memory, a memory card controller, a camera, a lighting, an audio and moving picture playback processor, a wireless radio antenna, a speaker, a microphone, a USB port, or a unit having other various functions.

The microprocessor unit 220 or the function unit 240 may include the semiconductor devices formed according to the methods of fabricating the semiconductor devices in accordance with some embodiments of the inventive concepts.

Referring to FIG. 14C, the electronic system 300 in accordance with some embodiments of the inventive concepts may include a microprocessor 314, a memory 312, and a user interface 318 that perform data communication using a bus 320. The microprocessor 314 may include a CPU or an AP. The electronic system 300 may further include a RAM 316 in direct communication with the microprocessor 314. The microprocessor 314 and/or the RAM 316 may be assembled within a single package. The user interface 318 may be used to input data to the electronic system 300, or output data from the electronic system 300. For example, the user interface 318 may include a touch pad, a touch screen, a keyboard, a mouse, a scanner, a voice detector, a cathode ray tube (CRT) monitor, an LCD, an AMOLED, a plasma display pad (PDP), a printer, a lighting, or various input/output devices. The memory 312 may store operational codes of the microprocessor 314, data processed by the microprocessor 314, or data received from the outside. The memory 312 may include a memory controller, a hard disk, or a solid state drive (SSD).

The microprocessor 314, the RAM 316, and/or the memory 312 may include semiconductor devices formed according to the methods of fabricating semiconductor devices in accordance with some embodiments of the inventive concepts.

According to some embodiments of the inventive concepts, methods of fabricating semiconductor devices capable of reducing the occurrence of defects and improving productivity may be provided.

Although a few embodiments have been described with reference to the accompanying drawings, those skilled in the art will readily appreciate that many modifications are possible in embodiments without departing from the scope of the inventive concepts and without changing essential features. Therefore, the above-described embodiments should be considered in a descriptive sense only and not for purposes of limitation.

What is claimed is:

1. A method of fabricating a semiconductor device, comprising:
   forming an isolation region that defines a plurality of fin active regions on a semiconductor substrate, ones of the plurality of fin active regions extending parallel to each other in a first direction, wherein the plurality of fin active regions comprise
      a first fin active region and a second fin active region that are spaced apart from each other by a first distance, a third fin active region and a fourth fin active region that are spaced apart from each other by a second distance that is smaller than the first distance, and an edge fin active region;

forming a sacrificial gate layer on the semiconductor substrate having the isolation region;

forming a plurality of hard mask lines on the sacrificial gate layer, wherein the plurality of hard mask lines comprise
- a first hard mask line configured to cross the first and second fin active regions,
- a second hard mask line configured to cross the third and fourth fin active regions, and
- an edge hard mask line configured to cross the edge fin active region;

forming a gate cut mask comprising a plurality of gate cut openings on the semiconductor substrate having the hard mask lines, wherein the plurality of gate cut openings comprise a first gate cut opening, a second gate cut opening, and an edge gate cut opening, wherein
- the first and second gate cut openings and the edge gate cut opening have line shapes that are parallel to each other,
- the first and second gate cut openings are spaced apart from each other and expose the first hard mask line on the sacrificial gate layer between the first and second fin active regions,
- the edge gate cut opening does not overlap the edge fin active region and exposes an end portion of the edge hard mask line,
- each of the first and second gate cut openings has a first width that are equal to each other, and
- the edge gate cut opening has a second width that is greater than the first width but smaller than twice a size of the first width;

etching the hard mask lines using the gate cut mask as an etch mask to form hard mask patterns; and removing the gate cut mask.

2. The method of claim 1, wherein the gate cut mask further includes a third gate cut opening,
wherein the third gate cut opening exposes the second hard mask line on the sacrificial gate layer between the third and fourth fin active regions.

3. The method of claim 2, wherein the third gate cut opening has a third width that is greater than the second width.

4. The method of claim 2, wherein the third gate cut opening has a width that is greater than the first width but smaller than a 22 times the size of the first width.

5. The method of claim 1, wherein a distance between the first and second gate cut openings is at least 20 times the size of the first width.

6. The method of claim 1,
wherein the edge gate cut opening comprises a first side wall and a second side wall that are parallel to the edge fin active region,
wherein the first side wall of the edge gate cut opening overlaps the edge hard mask line, and
wherein the second side wall of the edge gate cut opening does not overlap the edge hard mask line.

7. The method of claim 6, wherein a distance between the first side wall of the edge gate cut opening and the end portion of the edge hard mask line is greater than a distance between the second side wall of the edge gate cut opening and the end portion of the edge hard mask line.

8. The method of claim 6, wherein a distance between the first side wall of the edge gate cut opening and the end portion of the edge hard mask line is the same as the first width of each of the first and second gate cut openings.

9. The method of claim 1, wherein the hard mask patterns comprise:
a first hard mask pattern that overlaps the first fin active region;
a second hard mask pattern that overlaps the second fin active region;
an intermediate hard mask pattern between the first and second hard mask patterns;
a third hard mask pattern that overlaps the third fin active region;
a fourth hard mask pattern that overlaps the fourth fin active region; and
an edge hard mask pattern that overlaps the edge fin active region,
wherein the intermediate hard mask pattern does not overlap the plurality of fin active regions.

10. The method of claim 1, further comprising:
etching the sacrificial gate layer using the hard mask patterns as etch masks to form sacrificial gate patterns;
forming gate spacers on side surfaces of the sacrificial gate patterns and the hard mask patterns, and side surfaces of protruding parts of the fin active regions;
etching the fin active regions using the hard mask patterns and the gate spacers as etch masks to form active recessed regions;
performing a selective epitaxial growth (SEG) process to form semiconductor layers in the active recessed regions, wherein the semiconductor layers fill the active recessed regions and protrude from the fin active regions, and wherein protruding parts of the semiconductor layers have widths that are greater than widths of the fin active regions;
forming a planarized interlayer insulating layer on side walls of the sacrificial gate patterns;
removing the hard mask patterns;
removing the sacrificial gate patterns to form gate trenches; and
forming gate structures in the gate trenches.

11. A method of fabricating a semiconductor device, comprising:
forming an isolation region that defines a plurality of fin active regions on a semiconductor substrate, ones of the plurality of fin active regions extending parallel to each other in a first direction, wherein the plurality of fin active regions comprise
a first fin active region and a second fin active region that are spaced apart from each other by a first distance,
a third fin active region and a fourth fin active region that are spaced apart from each other by a second distance that is smaller than the first distance, and
an edge fin active region;
forming a sacrificial gate layer on the semiconductor substrate having the isolation region;
forming a plurality of hard mask lines on the sacrificial gate layer, ones of the plurality of hard mask lines extending parallel to each other in a second direction that is perpendicular to the first direction, wherein the plurality of hard mask lines comprise
a first hard mask line that crosses the first and second fin active regions,
a second hard mask line that crosses the third and fourth fin active regions, and an edge hard mask line that crosses the edge fin active region and extends over the isolation region;

forming a gate cut mask comprising a plurality of gate cut openings on the semiconductor substrate having the plurality of hard mask lines, wherein the plurality of gate cut openings comprise a first gate cut opening and a second gate cut opening on the sacrificial gate layer between the first and second fin active regions that expose the first hard mask line and that a extend parallel to each other in the first direction; and a third gate cut opening on the sacrificial gate layer between the third and fourth fin active regions and that exposes the second hard mask line, wherein the first and second gate cut openings each have a first width that is the same, and wherein a distance between the first and second gate cut openings is at least 20 times a size of the first width;

etching the hard mask lines using the gate cut mask as an etch mask to form hard mask patterns; and removing the gate cut mask.

12. The method of claim 11, wherein the plurality of gate cut openings further include an edge gate cut opening that extends in a line shape that is parallel to the edge fin active region, that does not overlap the edge fin active region, and that exposes the edge hard mask line, wherein the edge gate cut opening has a first side wall and a second side wall that extend parallel to the edge fin active region, wherein the first side wall of the edge gate cut opening overlaps the edge hard mask line, wherein the second side wall of the edge gate cut opening does not overlap the edge hard mask line, and wherein a distance between the first side wall of the edge gate cut opening and an end portion of the edge hard mask line is greater than a distance between the second side wall of the edge gate cut opening and the end portion of the edge hard mask line.

13. The method of claim 12, wherein the edge gate cut opening is parallel to the first and second gate cut openings and is formed in a line shape having a second width that is greater than the first width.

14. The method of claim 12, wherein a distance between the first gate cut opening and the first fin active region, a distance between the second gate cut opening and the second fin active region, a distance between the third gate cut opening and the third fin active region, a distance between the fourth gate cut opening and the fourth fin active region, and a distance between the edge gate cut opening and the edge fin active region are all the same.

15. The method of claim 11, wherein the third gate cut opening has a width that is greater than the first and second gate cut openings.

16. A method of fabricating a semiconductor device, comprising:

forming a plurality of fin-shaped active regions that extend parallel to each other in a first direction, the plurality of fin-shaped active regions comprising a first active region and a second active region that are spaced apart from each other by a first distance, and the plurality of fin-shaped active regions comprising a third active region and a fourth active region that are spaced apart from each other by a second distance that is less than the first distance;

partially filling a trench that extends around and between ones of the plurality of fin-shaped active regions with an insulating material to form an isolation region, the isolation region comprising a first isolation region that extends continuously between a portion of the first active region and a portion of the second active region and a second isolation region that extends continuously between a portion of the third active region and a portion of the fourth active region;

forming a sacrificial gate layer that covers the plurality of fin-shaped active regions and the isolation region;

forming a plurality of hard mask lines on the sacrificial gate layer, ones of the plurality of hard mask lines extending parallel to each other in a second direction that is perpendicular to the first direction, the plurality of hard mask lines comprising a first hard mask line that crosses the first and second active regions and the first portion of the isolation region therebetween, and the plurality of hard mask lines comprising a second hard mask line that crosses the third and fourth active regions and the second portion of the isolation region therebetween;

forming a gate cut mask that covers the plurality of hard mask lines and the sacrificial gate layer, the gate cut mask comprising a first opening that extends in the first direction adjacent to the first active region and that exposes a first portion of the first hard mask line and first portions of the first isolation region, comprising a second opening that extends in the first direction adjacent to the second active region and that exposes a second portion of the first hard mask line and second portions of the first isolation region, and comprising a third opening that extends between the third and fourth active regions and exposes a portion of the second hard mask line and portions of the second isolation region; and etching the plurality of hard mask lines using the gate cut mask as an etch mask, wherein the first hard mask line is etched to form a first hard mask pattern that crosses the first active region, a second hard mask pattern that crosses the second active region, and an intermediate hard mask pattern therebetween, and wherein the second hard mask line is etched to form a third hard mask pattern that crosses the third active region, and a fourth hard mask pattern that crosses the fourth active region, without an intermediate hard mask pattern therebetween.

17. The method of claim 16, wherein a distance between the first opening and the first active region, a distance between the second opening and the second active region, a distance between the third opening and the third active region, and a distance between the third opening and the fourth active region are all equal.

18. The method of claim 16, wherein a width in the second direction of the first opening is equal to a width in the second direction of the second opening, wherein a distance between the first opening and the second opening is greater than 20 times the width of the first opening, and wherein a width of the third opening in the second direction is less than 22 times the width of the first opening.

19. The method of claim 16, wherein the plurality of fin-shaped active regions comprises an edge active region that is an outermost one of the plurality of fin-shaped active regions in the second direction, wherein the plurality of hard mask lines comprises a third hard mask line that crosses the edge active region and comprises an end portion, wherein the gate cut mask comprises a fourth opening that extends in the first direction over the end portion of the third hard mask line, wherein a width of the fourth opening in the second direction is greater than a width of the first opening in the second direction and less than 2 times the width of the first opening.

20. The method of claim 19, wherein a distance between the end portion of the third hard mask line and a first sidewall of the fourth opening that extends in the second direction over the third hard mask line is equal to the width of the first opening, and wherein a distance between the end portion of the third hard mask line and a second sidewall of the fourth opening that extends in the second direction opposite the first sidewall is less than the width of the first opening.

* * * * *